(12) United States Patent
Son et al.

(10) Patent No.: US 11,793,058 B1
(45) Date of Patent: Oct. 17, 2023

(54) DISPLAY APPARATUS HAVING A LIGHT EMITTING LAYER DISPOSED IN A PORTION OF THE OPENING PERIPHERAL AREA

(71) Applicant: SAMSUNG DISPLAY CO., LTD., Yongin-si (KR)

(72) Inventors: Sewan Son, Yongin-si (KR); Jinsung An, Suwon-si (KR); Minwoo Woo, Seoul (KR); Wangwoo Lee, Osan-si (KR); Jiseon Lee, Hwaseong-si (KR); Haejin Kim, Hwaseong-si (KR); Seongjun Lee, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/954,676

(22) Filed: Sep. 28, 2022

Related U.S. Application Data

(62) Division of application No. 16/991,486, filed on Aug. 12, 2020, now Pat. No. 11,489,023.

(30) Foreign Application Priority Data

Aug. 13, 2019 (KR) .......................... 10-2019-0098578

(51) Int. Cl.
| | |
|---|---|
| H10K 50/11 | (2023.01) |
| H10K 59/88 | (2023.01) |
| H10K 50/844 | (2023.01) |
| H10K 59/124 | (2023.01) |
| H10K 59/131 | (2023.01) |
| H10K 71/20 | (2023.01) |
| H10K 59/12 | (2023.01) |

(52) U.S. Cl.
CPC .......... *H10K 59/88* (2023.02); *H10K 50/844* (2023.02); *H10K 59/124* (2023.02); *H10K 59/131* (2023.02); *H10K 71/221* (2023.02); *H10K 50/11* (2023.02); *H10K 59/1201* (2023.02)

(58) Field of Classification Search
CPC .. H10K 59/88; H10K 59/1201; H10K 59/124; H10K 59/131; H10K 50/11; H10K 50/844; H10K 71/221
USPC ..................................................... 257/40, 79
See application file for complete search history.

(56) References Cited

U.S. PATENT DOCUMENTS

| | | |
|---|---|---|
| 9,257,563 B2 | 2/2016 | Ahn et al. |
| 2020/0066826 A1 | 2/2020 | Kim et al. |

(Continued)

FOREIGN PATENT DOCUMENTS

| | | |
|---|---|---|
| JP | 1999-143103 | 5/1999 |
| KR | 10-2017-0015632 | 2/2017 |

*Primary Examiner* — Hoai V Pham
(74) *Attorney, Agent, or Firm* — F. Chau & Associates, LLC

(57) ABSTRACT

A display apparatus includes: a base substrate including a display area, an opening area, and an opening peripheral area between the opening area and the display area, wherein the display area surrounds the opening area, and the opening peripheral area has an annular shape; a conductive pattern disposed on the base substrate in the opening peripheral area and having an annular shape; and a light emitting layer disposed on the base substrate and in a portion of the opening peripheral area, and including an organic material, and wherein the light emitting layer is not formed at a portion of opening peripheral area that is adjacent to the opening area.

10 Claims, 20 Drawing Sheets

(56) References Cited

U.S. PATENT DOCUMENTS

2021/0050391 A1    2/2021  Son et al.
2023/0098291 A1*  3/2023  Wang ..................... H10K 59/40
                                                                     257/40

\* cited by examiner

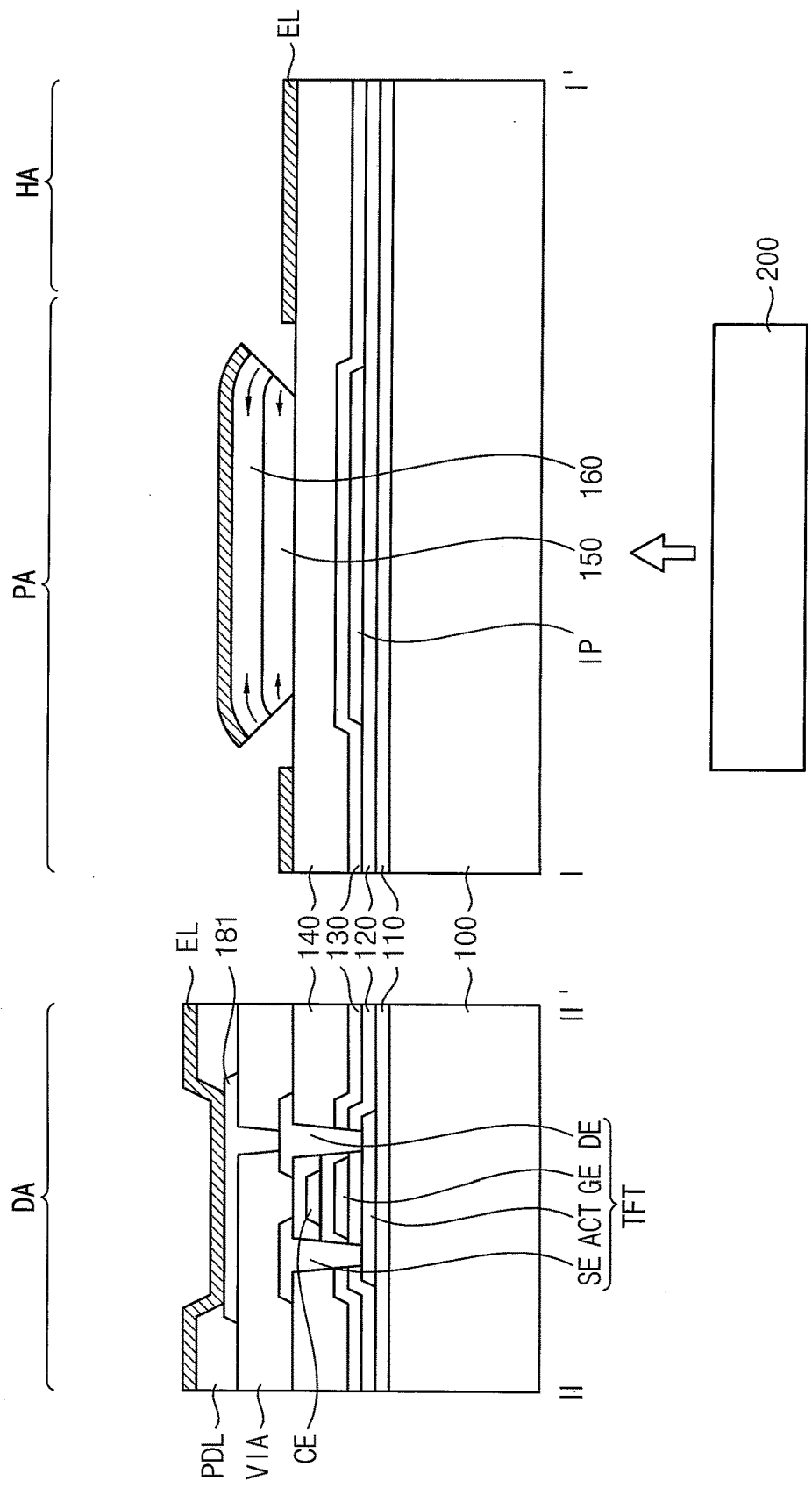

DISPLAY APPARATUS HAVING A LIGHT EMITTING LAYER DISPOSED IN A PORTION OF THE OPENING PERIPHERAL AREA

CROSS-REFERENCE TO RELATED APPLICATIONS

This application is a divisional application of U.S. patent application Ser. No. 16/991,486 filed on Aug. 12, 2020, which claims priority under 35 USC § 119 to Korean Patent Application No. 10-2019-0098578, filed on Aug. 13, 2019, in the Korean Intellectual Property Office (KIPO), the disclosures of which are incorporated by reference herein in their entireties.

TECHNICAL FIELD

Exemplary embodiments of the present inventive concept relate to a display apparatus and a method of manufacturing the display apparatus. More particularly, exemplary embodiments of the present inventive concept relate to a display apparatus capable of increasing display quality and a method of manufacturing the display apparatus.

DISCUSSION OF THE RELATED ART

Currently, a display apparatus having light weight and small size has been under development. A cathode ray tube (CRT) display apparatus has been used due to its performance and a competitive price. However, the CRT display apparatus has a relatively large size and lacks portability. Therefore, a display apparatus such as a plasma display apparatus, a liquid crystal display apparatus and an organic light emitting display apparatus has been increasingly used due to its small size, light weight and low-power-consumption.

In an attempt to enlarge a display area of the display apparatus, a bezel-less display apparatus, a display apparatus including a notch, and the like have been under development. In addition, a display apparatus in which a hole is formed in the display area and a camera, sensor or the like is positioned in the hole has been under development.

SUMMARY

According to an exemplary embodiment of the present inventive concept, a display apparatus includes: a base substrate including a display area, an opening area, and an opening peripheral area between the opening area and the display area, wherein the display area surrounds the opening area, and the opening peripheral area has an annular shape; a conductive pattern disposed on the base substrate in the opening peripheral area and having an annular shape; and a light emitting layer disposed on the base substrate and in a portion of the opening peripheral area, and including an organic material, and wherein the light emitting layer is not formed at a portion of opening peripheral area that is adjacent to the opening area.

In an exemplary embodiment of the present inventive concept, the conductive pattern includes metal.

In an exemplary embodiment of the present inventive concept, the conductive pattern is spaced apart from the light emitting layer.

In an exemplary embodiment of the present inventive concept, a hole penetrating the display apparatus is formed in the opening area, and a cutting surface providing the hole is formed, and the cutting surface and the light emitting layer formed in the opening peripheral area are spaced apart from each other.

In an exemplary embodiment of the present inventive concept, the conductive pattern is disposed between the cutting surface and the light emitting layer.

In an exemplary embodiment of the present inventive concept, the conductive pattern is exposed at the cutting surface.

In an exemplary embodiment of the present inventive concept, the display apparatus further includes: an active pattern disposed on the base substrate in the display area; a first insulating layer disposed on the base substrate; a gate pattern including a gate electrode of a thin film transistor and the conductive pattern, and disposed on the first insulating layer; a second insulating layer disposed on the gate pattern; a source drain pattern disposed on the second insulating layer and including a source electrode and a drain electrode of the thin film transistor, wherein the source electrode and the drain electrode are electrically connected to the active pattern; a via insulating layer disposed on the source drain pattern in the display area; a pixel electrode disposed in the display area and between the via insulating layer and the light emitting layer, wherein the pixel electrode is electrically connected to the thin film transistor; and a thin film encapsulation layer disposed on the light emitting layer and including a first inorganic layer, an organic layer disposed on the first inorganic layer, and a second inorganic layer disposed on the organic layer.

In an exemplary embodiment of the present inventive concept, the organic layer of the thin film encapsulation layer is not formed in the opening peripheral area, wherein the first inorganic layer and the second inorganic layer of the thin film encapsulation layer contact each other, and the first inorganic layer covers a side surface of the light emitting layer disposed in the opening peripheral area.

In an exemplary embodiment of the present inventive concept, the first and second inorganic layers are not formed in the portion of the opening peripheral area that is adjacent to the opening area.

According to an exemplary embodiment of the present inventive concept, a display apparatus includes: a base substrate including a display area, an opening area, and an opening peripheral area between the opening area and the display area, wherein the display area surrounds the opening area, and the opening peripheral area has an annular shape; and a light emitting layer disposed on the base substrate and in a portion of the opening peripheral area, and including an organic material, wherein a hole penetrating the display apparatus is formed in the opening area, and a cutting surface providing the hole is formed, and the cutting surface and the light emitting layer formed in the opening peripheral area are spaced apart from each other.

According to an exemplary embodiment of the present inventive concept, a method of manufacturing a display apparatus includes: forming a heating pattern having a conductivity in an opening peripheral area on a base substrate, wherein the base substrate includes a display area, an opening area, and the opening peripheral area between the opening area and the display area, wherein the display area surrounds the opening area, and the opening peripheral area has an annular shape; forming a first heat shrink layer having a first heat shrink rate on the heating pattern forming a second heat shrink layer having a second heat shrink rate greater than the first heat shrink rate on the first heat shrink layer; forming a light emitting layer including an organic material on the second heat shrink layer and the base substrate; applying a magnetic field to the heating pattern to generate an induction current to heat the first and second heat shrink layers; and removing a portion of the light emitting layer formed on the second heat shrink layer.

In an exemplary embodiment of the present inventive concept, in forming the first and second heat shrink layers, an edge of the second heat shrink layer is formed to cover an edge of the first heat shrink layer.

In an exemplary embodiment of the present inventive concept, the method further including: forming a thin film encapsulation layer including a first inorganic layer, an organic layer, and a second inorganic layer on the light emitting layer, after removing the portion of the light emitting layer, wherein the organic layer of the thin film encapsulation layer is not formed in the opening peripheral area, wherein the first inorganic layer and the second inorganic layer of the thin film encapsulation layer contact each other, and the first inorganic layer covers a side surface of the light emitting layer disposed in the opening peripheral area.

In an exemplary embodiment of the present inventive concept, the method further includes: forming a hole penetrating the display apparatus in the opening area after forming the thin film encapsulation layer.

In an exemplary embodiment of the present inventive concept, in forming the hole, a portion of the heating pattern is removed, wherein side surfaces of the heating pattern are exposed at a cutting surface providing the hole.

In an exemplary embodiment of the present inventive concept, in forming the hole, a cutting surface providing the hole is spaced apart from the light emitting layer formed in the opening peripheral area.

In an exemplary embodiment of the present inventive concept, in applying the magnetic field, the magnetic field is provided by an induction heater including a coil and an alternating current generator.

In an exemplary embodiment of the present inventive concept, the heating pattern is formed to have an annular shape in the opening peripheral area, and wherein in forming the first and second heat shrink layers, the first and second heat shrink layers are formed in a shape of a circle overlapping the heating pattern.

In an exemplary embodiment of the present inventive concept, the method further including: forming a thin film encapsulation layer on the light emitting layer before removing the portion of the light emitting layer, and wherein in removing the portion of the light emitting layer, the first and second heat shrink layers, the portion of the light emitting layer formed on the second heat shrink layer, and a portion of the thin film encapsulation layer formed on the light emitting layer are removed.

In an exemplary embodiment of the present inventive concept, the first heat shrink layer includes an epoxy resin or polyimide, and the second heat shrink layer includes at least one of acrylic resin, polyolefin, polyvinyl chloride (PVC), polyester (PET) or polymethyl methacrylate (PMMA).

BRIEF DESCRIPTION OF THE DRAWINGS

The above and other features of the present inventive concept will become more apparent by describing in detail exemplary embodiments thereof, with reference to the accompanying drawings, in which:

FIGS. 3A, 3B, 3C, 3D, 3E, 3F, 3G, 3H and 3I are cross-sectional views illustrating a method of manufacturing a display apparatus according to an exemplary embodiment of the present inventive concept;

DETAILED DESCRIPTION OF THE EMBODIMENTS

Hereinafter, the present inventive concept will be explained in detail with reference to the accompanying drawings.

Figure 1:
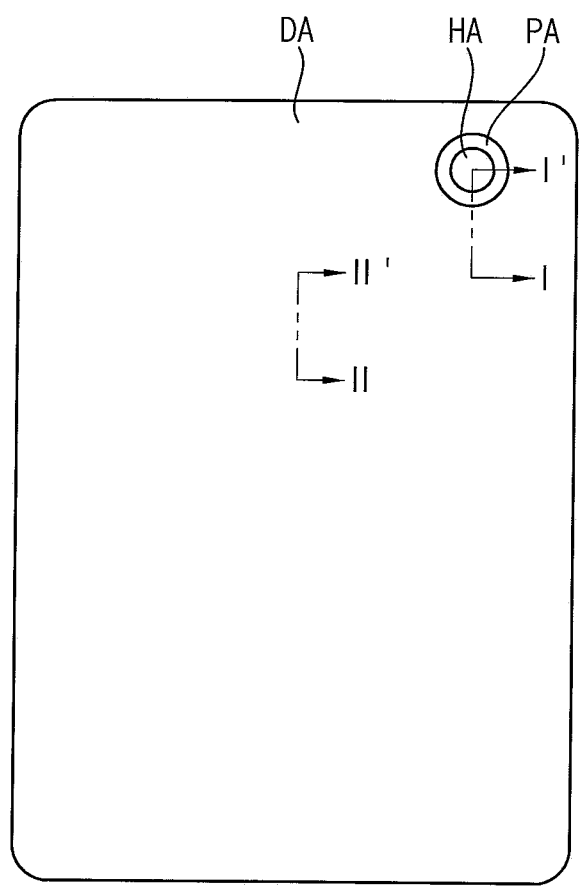
FIG. 1 is a plan view illustrating a display apparatus according to an exemplary embodiment of the present inventive concept.
Figure 2:
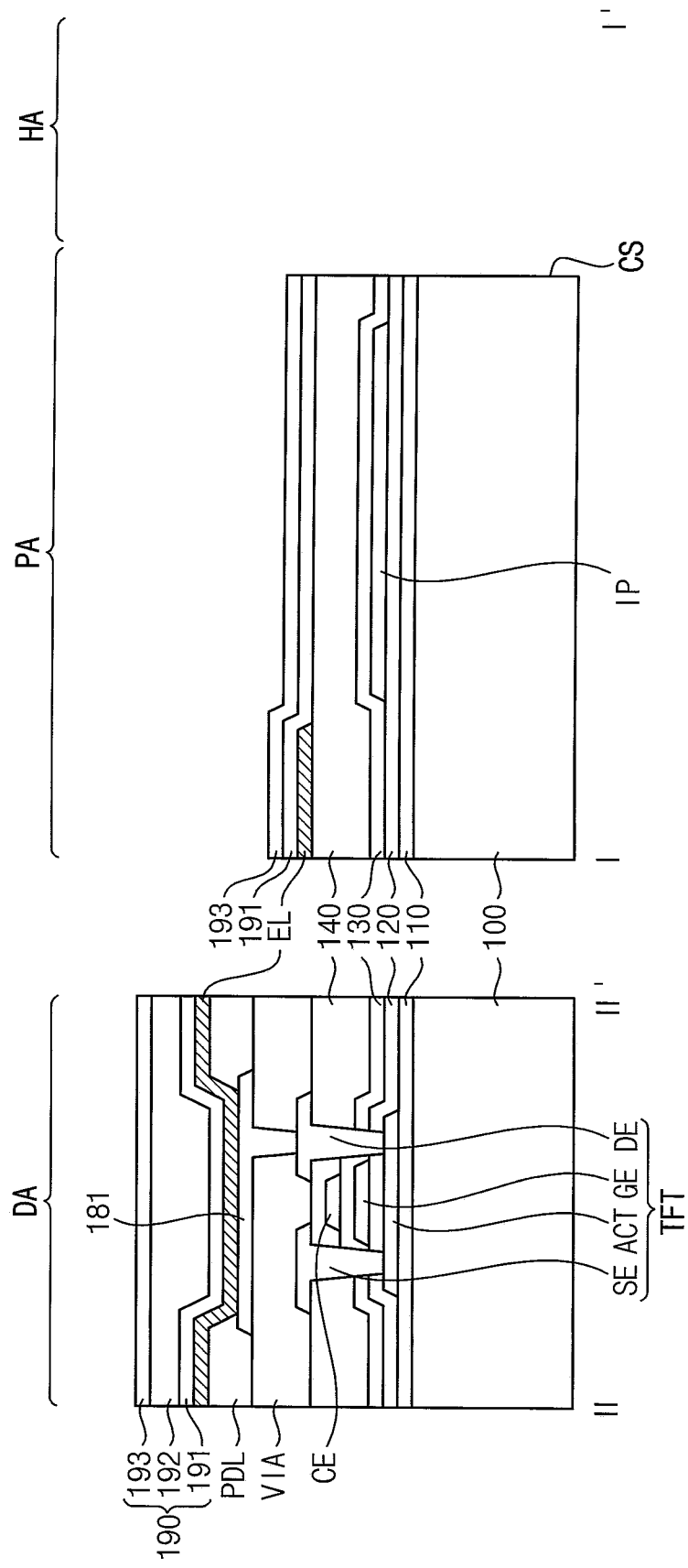
FIG. 2 is a cross-sectional view taken along a line I-I' and a line II-II' of FIG. 1.

FIG. 1 is a plan view illustrating a display apparatus according to an exemplary embodiment of the present inventive concept. FIG. 2 is a cross-sectional view taken along a line I-I' and a line II-II' of FIG. 1.

Referring to FIGS. 1 and 2, the display apparatus may include a display area DA, an opening area HA, and an opening peripheral area PA.

A peripheral area that is a non-display area in which an image is not displayed may be formed along an edge of the display apparatus. For example, the non-display area may at least partially surround the display area DA.

In the display area DA, a plurality of pixels for displaying an image may be arranged in a matrix form. Each pixel may include a thin film transistor TFT and a light emitting structure disposed on the base substrate 100.

The opening area HA is surrounded by the display area DA. The opening peripheral area PA is a non-display area disposed between the opening area HA and the display area DA. The opening peripheral area PA may have a ring shape or annular shape surrounding the opening area HA.

The opening area HA may transmit light. For example, a circular hole penetrating the display apparatus may be formed in the opening area HA, or a transparent window may be formed.

An optical module or sensor may be disposed in the opening area HA or overlapping the opening area HA under the opening area HA of the display apparatus. For example, the optical module may include a camera module for capturing (or, e.g., recognizing) an image of an object, a face recognition sensor for sensing a face of a user, a pupil and/or iris recognition sensor for sensing a pupil and/or iris of a user, an acceleration sensor and/or a geomagnetic sensor for determining movement of the display apparatus, a proximity sensor and/or an infrared sensor for detecting proximity to the display apparatus, a light intensity sensor for measuring a degree of brightness from external light, etc.

Referring to FIG. 2, the display apparatus may include the base substrate 100, a buffer layer 110, an active pattern ACT, a first insulating layer 120, a first gate pattern, and a second insulating layer 130, a second gate pattern, a third insulating layer 140, a source drain pattern, a via insulating layer VIA, a pixel defining layer PDL, a light emitting structure, and a thin film encapsulation layer 190.

The base substrate 100 may be made of, for example, a transparent or opaque material. For example, the base substrate 100 may be a quartz substrate, a synthetic quartz substrate, a calcium fluoride substrate, a fluorine-doped quartz substrate, a soda lime glass substrate, or a non-alkali (non-alkali) glass substrates and the like. For example, the base substrate 100 may be made of a transparent resin substrate having flexibility. Examples of the transparent resin substrate that can be used as the base substrate 100 include a polyimide substrate.

The buffer layer 110 may be disposed on the base substrate 100. For example, the buffer layer 110 may cover an entire surface of the base substrate 100. The buffer layer 110 may prevent the diffusion of metal atoms and/or impurities from the base substrate 100 into the active pattern ACT. In addition, the buffer layer 110 may control a rate of a heat transfer in a crystallization process for forming the active pattern ACT, thereby obtaining substantially uniform active pattern ACT.

The active pattern ACT may be disposed in the display area DA and on the buffer layer 110. The active pattern ACT may include, for example, amorphous silicon or polycrystalline silicon. In an exemplary embodiment of the present inventive concept, the active pattern ACT may be formed of at least one of indium (In), gallium (Ga), stanium (Sn), zirconium (Zr), vanadium (V), hafnium (H), cadmium (Cd), and germanium (Ge), chromium (Cr), titanium (Ti) and/or zinc (Zn). The active pattern ACT may include a drain region and a source region doped with impurities and a channel region between the drain region and the source region.

The first insulating layer 120 may be disposed on the buffer layer 110, on which the active pattern ACT is disposed. The first insulating layer 120 may cover the active pattern ACT disposed on the buffer layer 110 and may be disposed to have substantially the same thickness along the profile of the active pattern ACT. The first insulating layer 120 may include, for example, a silicon compound, a metal oxide, or the like. For example, the first insulating layer 120 may be formed of a plurality of layers or may be a single layer.

The first gate pattern may be disposed on the first insulating layer 120. The first gate pattern may include a gate electrode GE disposed in the display area DA and a heating pattern IP disposed in the opening peripheral area PA. For example, the heating pattern IP may include a metal. The heating pattern IP may be formed in a ring shape or annular shape along the peripheral area PA. The heating pattern IP may be a floating pattern. For example, the heating pattern IP may have a plurality of concentric ring shapes.

The second insulating layer 130 may be disposed on the first insulating layer 120, on which the first gate pattern is disposed. The second insulating layer 130 may cover the first gate pattern disposed on the first insulating layer 120, and may be disposed to have substantially the same thickness along the profile of the first gate pattern. The second insulating layer 130 may include, for example, a silicon compound, a metal oxide, or the like. For example, the second insulating layer 120 may be formed of a plurality of layers or may be a single layer.

The second gate pattern may be disposed on the second insulating layer 130. The second gate pattern may include a capacitor electrode CE disposed in the display area DA. The capacitor electrode CE may form a storage capacitor together with the gate electrode GE and the second insulating layer 120 therebetween.

In the present embodiment, the heating pattern IP has been described as being included in the first gate pattern, but may be formed as a separate layer or may be formed as the second gate pattern.

The third insulating layer 140 may be disposed on the second insulating layer 130, on which the second gate pattern is disposed. The third insulating layer 140 may cover the second gate pattern sufficiently to have a substantially flat upper surface without generating a step around the second gate pattern. In an exemplary embodiment of the present inventive concept, the second insulating layer 130 may cover the second gate pattern disposed on the second insulating layer 130, and may be disposed to have substantially the same thickness along the profile of the second gate pattern. For example, the third insulating layer 140 may be formed of a plurality of layers or may be a single layer.

The source drain pattern may be disposed on the third insulating layer 140. The source drain pattern may include a source electrode SE and a drain electrode DE disposed in the display area DA. The source electrode SE is electrically connected to the active pattern ACT through contact holes formed through the third insulating layer 140, the second insulating layer 130, and the first insulating layer 120. The drain electrode DE may be electrically connected to the active pattern ACT through another contact hole formed through the third insulating layer 140, the second insulating layer 130, and the first insulating layer 120.

Accordingly, a thin film transistor TFT including the active pattern ACT, the gate electrode GE, the source electrode SE, and the drain electrode DE may be disposed on the base substrate 100.

The via insulating layer VIA may be disposed on the thin film transistor TFT and the third insulating layer 140 in the display area DA. The via insulation layer VIA may be formed in a single layer structure, but may be formed in a multilayer structure including at least two insulating layers. The via insulation layer VIA may be formed using an organic material such as a photoresist, an acrylic resin, a polyimide resin, a polyamide resin, or a siloxane-based resin. In an exemplary embodiment of the present inventive concept, the via insulating layer VIA may be formed using an inorganic material such as a silicon compound, a metal, a metal oxide, or the like.

The light emitting structure may be disposed on the via insulation layer VIA. The light emitting structure may include a pixel electrode 181, a light emitting layer EL, and an opposite electrode.

The pixel electrode 181 may be disposed on the via insulation layer VIA in the display area DA. The pixel electrode 181 may be electrically connected to the thin film transistor TFT through a via hole formed through the via insulating layer VIA.

The pixel defining layer PDL may be disposed in the display area DA and on the via insulation layer VIA on which the pixel electrode 181 is disposed. For example, the pixel defining layer PDL may cover edge portions of the pixel electrode 181. The pixel defining layer PDL may be formed using an organic material. For example, the pixel defining layer PDL may include photoresist, acryl-based resin, polyimide-based resin, polyamide-based resin, siloxane-based resin, etc. In an exemplary embodiment of the present inventive concept, the pixel defining layer PDL may include an opening that exposes the pixel electrode 181, and the opening of the pixel defining layer PDL may be formed by etching the pixel defining layer PDL. An emitting area and a non-emitting area of the display apparatus may be formed by the opening of the pixel defining layer PDL. For example, a portion where the opening of the pixel defining layer PDL is located may correspond to an emitting area, and a non-emitting area may correspond to a portion adjacent to the opening of the pixel defining layer PDL.

The light emitting layer EL may have a multi layer structure including, for example, an organic light emitting layer, a hole injection layer (HIL), a hole transfer layer (HTL), an electron transfer layer (ETL), an electron injection layer (EIL), etc. In this case, the hole injection layer, the hole transport layer, the electron transport layer and the electron injection layer, except for the organic light emitting layer, may be formed in common to correspond to the plurality of pixels (see EL in FIG. 2). For example, the light emitting layer EL may be an organic material layer including an organic material.

The opposite electrode may be disposed on the light emitting layer EL. The opposite electrode may have a profile substantially the same as that of the light emitting layer EL. For example, the opposite electrode may extend along the light emitting layer EL and may be a common electrode of the plurality of pixels. The opposite electrode may be formed in a single layer structure or a multilayer structure including, for example, a metal film, an alloy film, a metal nitride film, a conductive metal oxide film, and/or a transparent conductive material film. A capping layer having substantially the same profile as the emission layer EL may be further formed on the opposite electrode. For example, the capping layer may extend along the opposite electrode.

The thin film encapsulation layer 190 may be disposed on the light emitting layer EL. For example, the thin film encapsulation layer 190 may be disposed on the opposite electrode. The thin film encapsulation layer 190 may prevent penetration of moisture and oxygen from outside. The thin film encapsulation layer 190 may include at least one organic layer and at least one inorganic layer. The at least one organic layer and the at least one inorganic layer may be alternately stacked with each other. For example, the thin film encapsulation layer 190 may include a first inorganic layer 191, a second inorganic layer 193 and an organic layer 192 therebetween, but the present inventive concept is not limited thereto.

In addition, since the organic layer 192 is not formed in the opening peripheral area PA, the first inorganic layer 191 and the first inorganic layer 191 may be disposed on the third insulating layer 140 in the opening peripheral area PA.

Accordingly, the first inorganic layer 191 and the second inorganic layer 193 of the thin film encapsulation layer 190 are in contact with each other in the opening peripheral area PA. A side surface of the light emitting layer EL disposed in the opening peripheral area PA may be covered by the first inorganic layer 191.

In the opening area HA, a hole is formed in the display apparatus, and a cutting surface CS forms the hole. For example, the opening area HA may be formed by forming a hole in the opening peripheral area PA, and a surface (e.g., a side surface or inner surface) of the opening peripheral area PA formed when the hole of the opening area HA is formed, in the opening peripheral area PA, may be the cutting surface CS. The base substrate 100, the buffer layer 110, the first insulating layer 120, the second insulating layer 130, the heating pattern IP, the third insulating layer 140, the first inorganic layer 191 and the second inorganic layer 193 may be sequentially disposed in a portion of the opening peripheral area PA which is adjacent to the opening area HA. The light emitting layer EL may be spaced apart from the cutting surface CS. In addition, the cutting surface CS and the heating pattern IP may be spaced apart from each other.

Accordingly, since the light emitting layer EL including the organic material is not exposed by the cutting surface CS of the opening peripheral area PA to the opening area HA, external moisture may be prevented from penetrating into the light emitting layer EL including the organic material in the display area DA through the hole of the opening area HA.

In addition, since a relatively complex or a relatively large structure for preventing external moisture penetration is not formed in the opening peripheral area PA, it is possible to reduce a width of the opening peripheral area PA, which is a non-display area, while still preventing penetration of external moisture in the display apparatus according to an exemplary embodiment of the present inventive concept.

FIGS. 3A to 3I are cross-sectional views illustrating a method of manufacturing a display apparatus according to an exemplary embodiment of the present inventive concept.

Figure 3A:
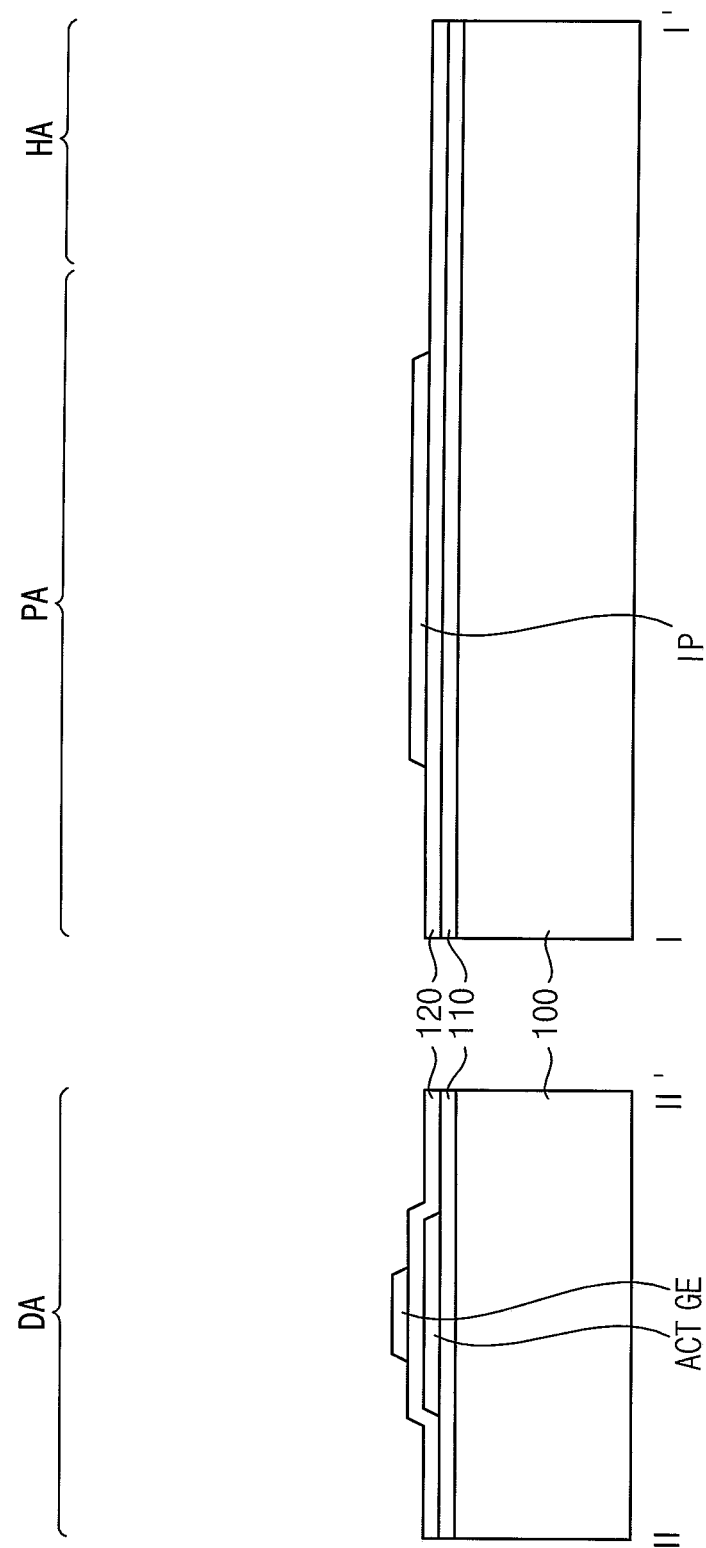

Referring to FIG. 3A, a buffer layer 110, an active pattern ACT and a first insulating layer 120 may be formed on the base substrate 100. A gate electrode GE in a display area DA and a heating pattern IP in an opening peripheral area PA may be formed on the first insulating layer 120.

Figure 3B:
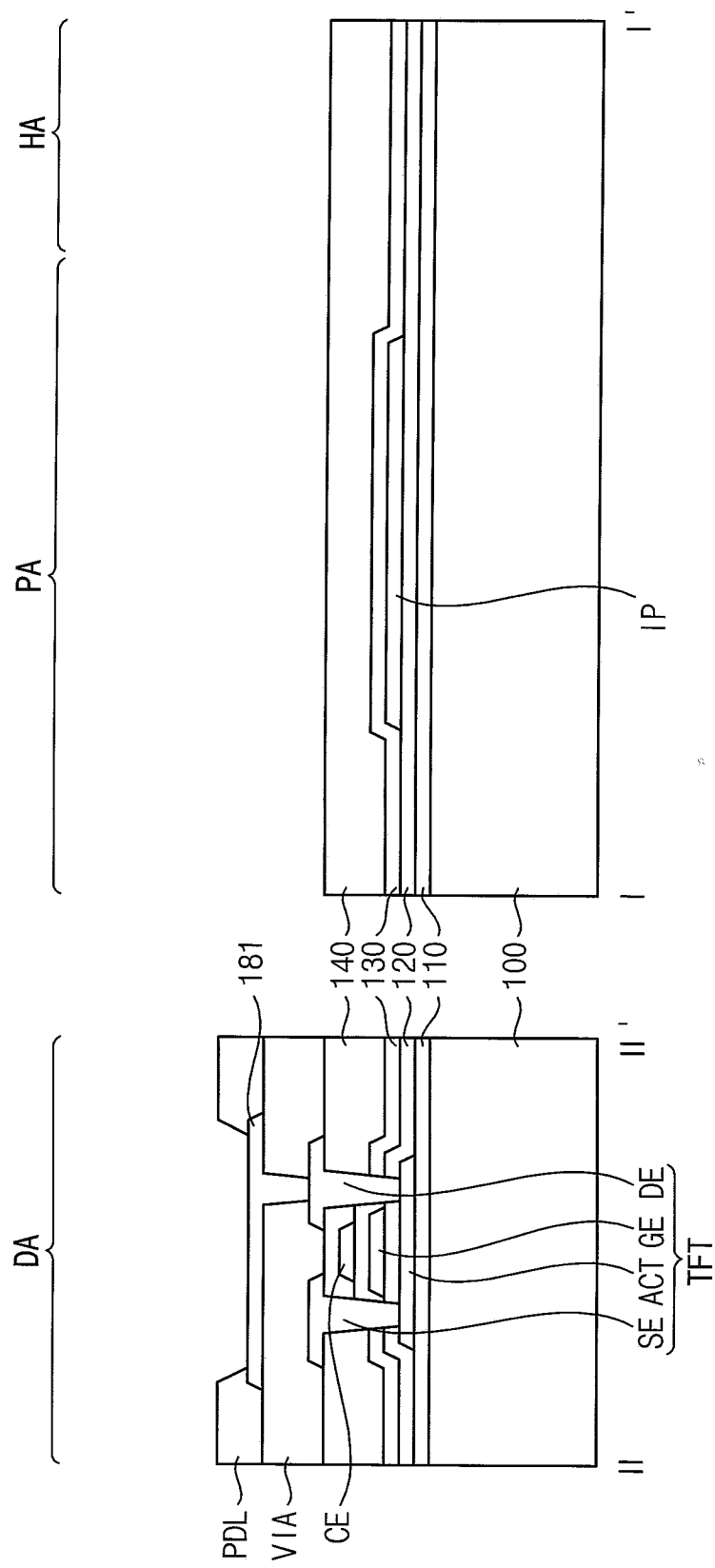

Referring to FIG. 3B, a second insulating layer 130, a capacitor electrode CE, and a third insulating layer 140 may be formed on the first insulating layer 120, on which the gate electrode GE and the heating pattern IP are formed. The third insulating layer 140 may be formed on the second insulating layer 130, which is formed on the first insulating layer 120. Thereafter, contact holes penetrating through the third insulating layer 140, the second insulating layer 130, and the first insulating layer 120 may be formed. Thereafter, a source electrode SE and a drain electrode DE may be formed on the third insulating layer 140 in which the contact holes are formed. A via insulating layer VIA may be formed on the third insulating layer 140, on which the source electrode SE and the drain electrode DE are formed. A via hole may be formed through the via insulation layer VIA to expose the drain electrode DE. A pixel electrode 181 may be formed on the via insulating layer VIA to be electrically connected to the drain electrode DE through the via hole. A pixel defining layer PDL having an opening exposing the pixel electrode 181 may be formed on the via insulating layer VIA, on which the pixel electrode 181 is formed.

In this case, an organic layer such as the via insulating layer VIA and the pixel defining layer PDL may not be formed in a portion of the opening peripheral area PA which is adjacent to the opening area HA.

Figure 3C:
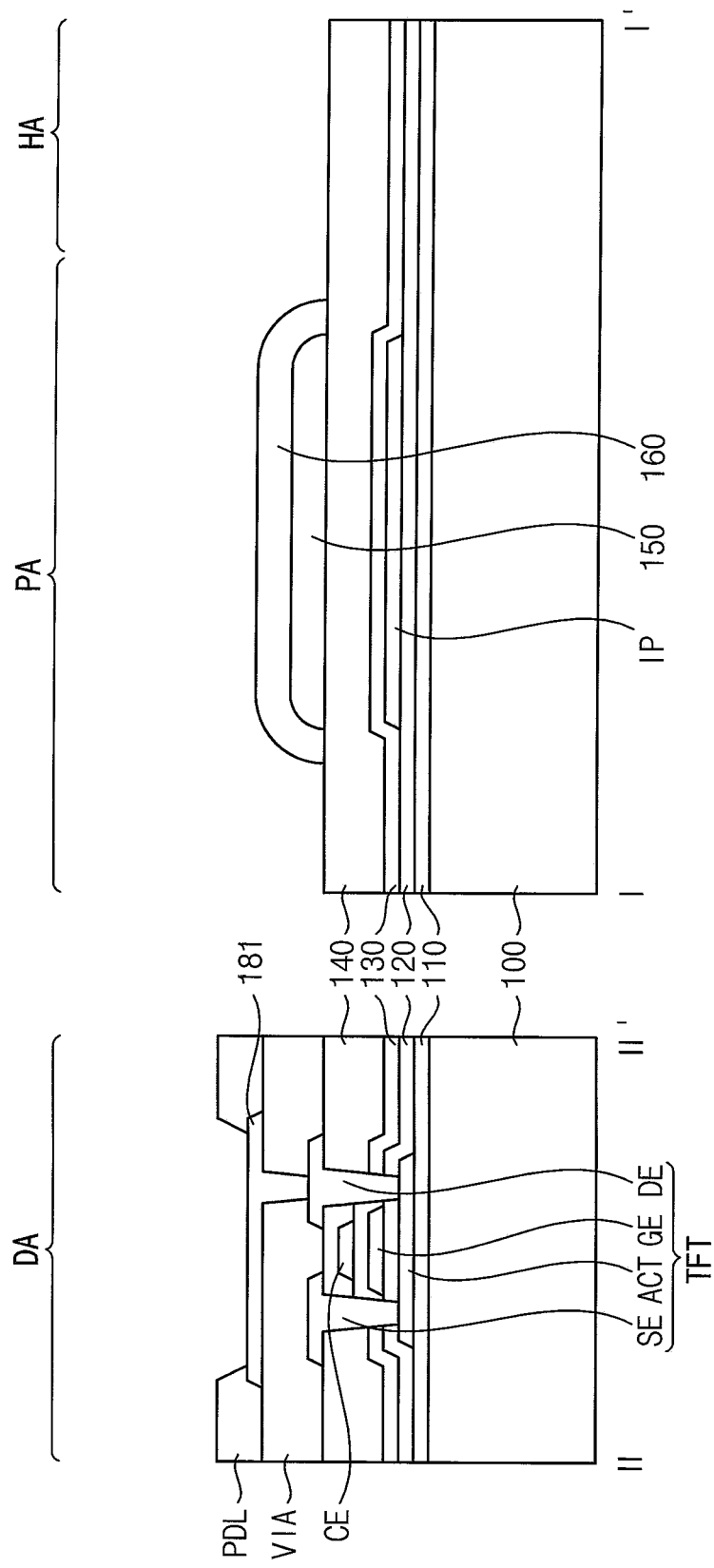

Referring to FIG. 3C, a first heat shrink layer 150 and a second heat shrink layer 160 disposed on the first heat shrink layer 150 may be formed on the heating pattern IP and the third insulating layer 140 in the opening peripheral area PA. The first heat shrink layer 150 and the second heat shrink layer 160 may include a material that shrinks when heat is applied thereto.

The first heat shrink layer 150 may be formed of a material having a first heat shrink rate. The second heat shrink layer 160 may be formed of a material having a second heat shrink rate greater than the first heat shrink rate. For example, when the first and second heat shrink layers 150 and 160 are heated, the second heat shrink layer 160 may shrink more than the first heat shrink layer 150.

For example, the first heat shrink layer 150 may include an epoxy resin, polyimide, or the like. The second heat shrink layer 160 may include, for example, at least one of polyolefin, polyvinyl chloride (PVC), polyester (PET), and/or polymethyl methacrylate (PMMA).

At this time, the second heat shrink layer 160 may cover the first heat shrink layer 150, so that an edge or a surface of the second heat shrink layer 160 makes contact with the third insulating layer 140. For example, an edge of the second heat shrink layer 160 may cover an edge of the first heat shrink layer 150, so that an edge or a surface of the second heat shrink layer 160 makes contact with the third insulating layer 140. As an additional example, the second heat shrink layer 160 may cover side surfaces of the first heat shrink layer 150.

Figure 3D:
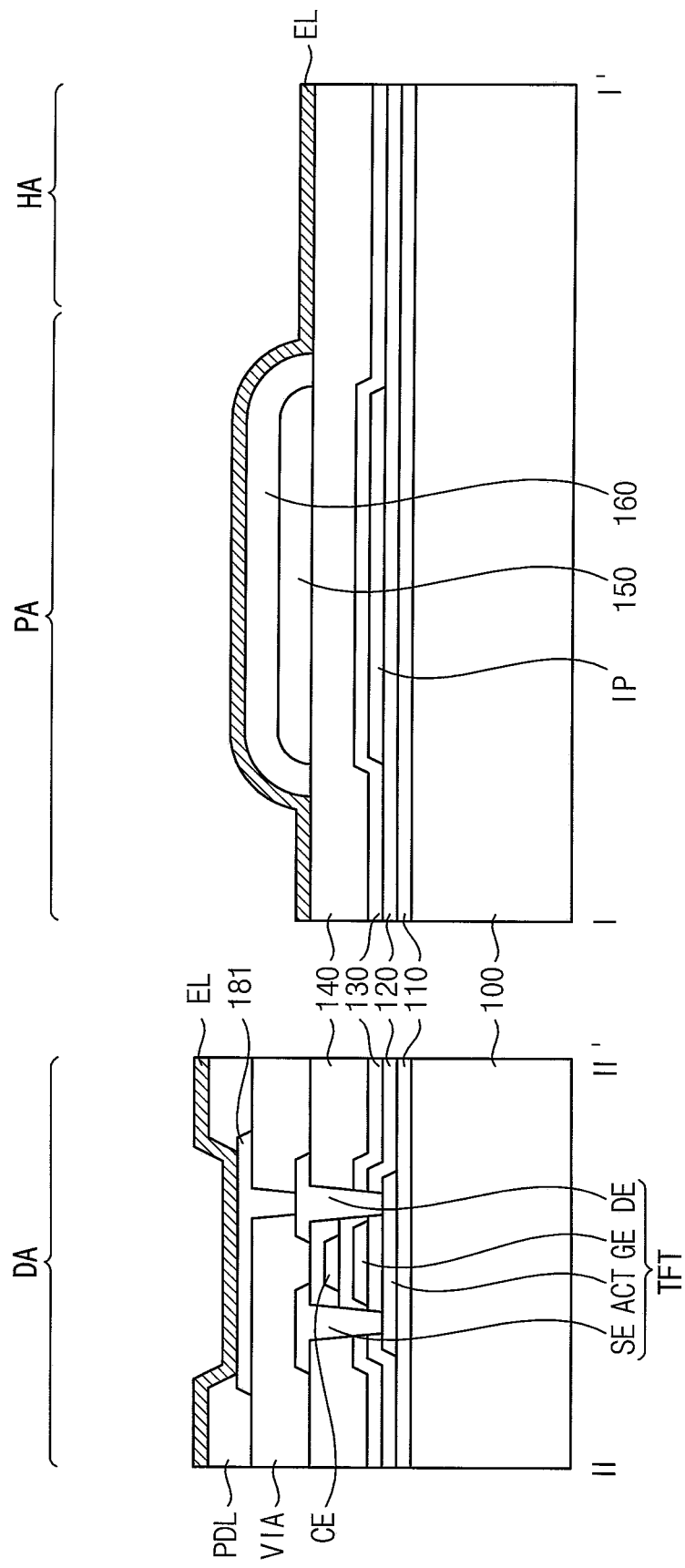

Referring to FIG. 3D, a light emitting layer EL may be formed on the second heat shrink layer 160, the third insulating layer 140, the pixel electrode 181, and the pixel defining layer PDL. An opposite electrode and a capping layer may be formed together on the light emitting layer EL.

Figure 3F:
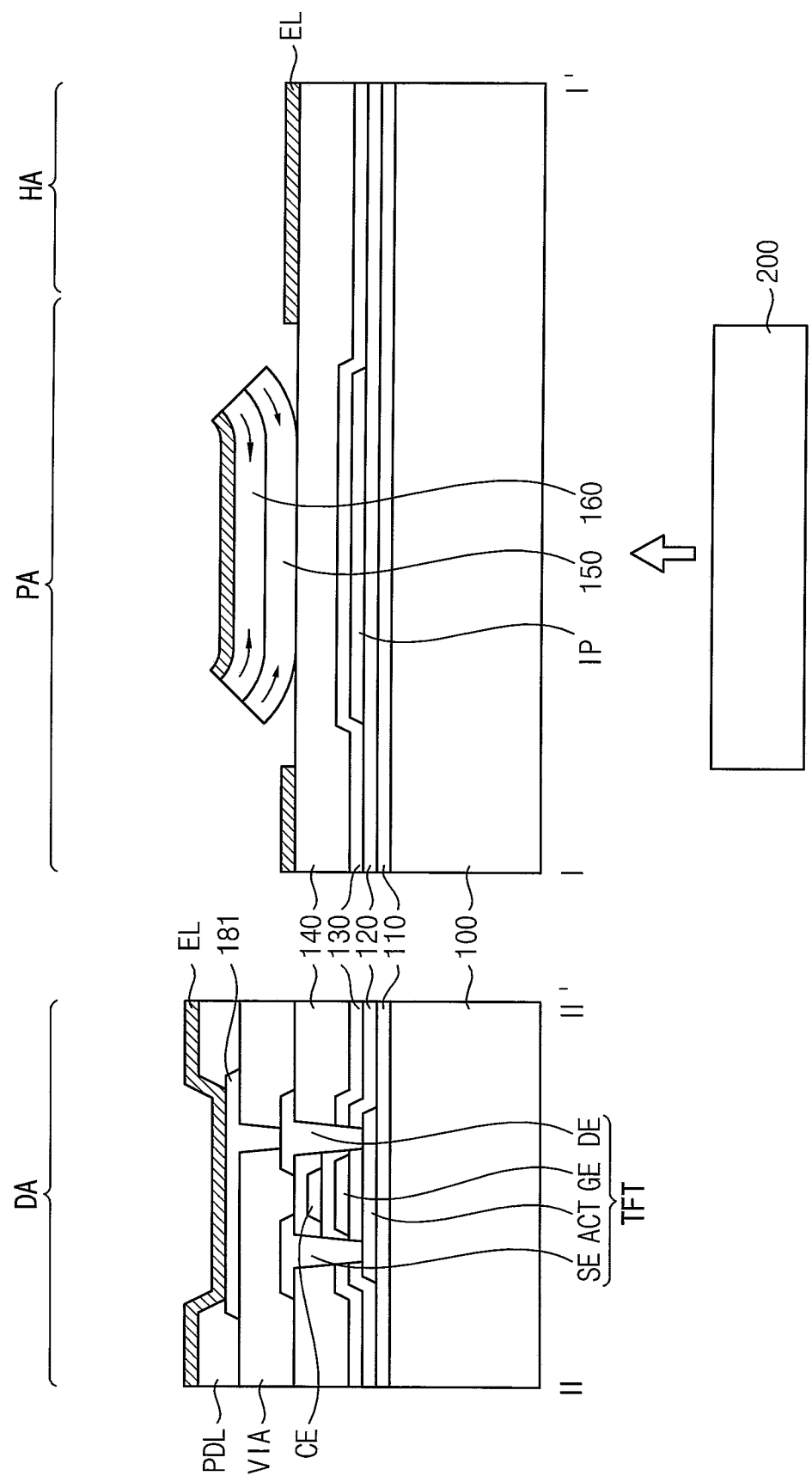

Referring to FIGS. 3E and 3F, an induced current may be generated by applying a magnetic field to the heating pattern IP. Accordingly, temperature of the heating pattern IP is increased by the induced current flowing through the heating pattern IP, and the first heat shrink layer 150 and the second heat shrink layer 160 are heated too.

In this case, the magnetic field may be provided by the induction heater 200 including a coil and an alternating current generator. For example, the first heat shrink layer 150 and the second heat shrink layer 160 may be heated using an induction current generated by the magnetic field from the induction heater 200 as a heat source.

For example, when an alternating current is passed through a coil of the induction heater 200, an alternating magnetic field alternating with time is formed in the coil. At this time, an alternating magnetic force is applied to the heating pattern IP, which is a conductive pattern including a metal. In the heating pattern IP, Foucault current is generated by an electromagnetic induction phenomenon. In addition, the first heat shrink layer 150 and the second heat shrink layer 160 may be heated by Joule heat generated by the Foucault current.

When the first heat shrink layer 150 and the second heat shrink layer 160 are heated, the second heat shrink layer 160 shrinks more than the first heat shrink layer 150. As described in FIG. 3F, edge portions of the first heat shrink layer 150 and the second heat shrink layer 160 are separated from the third insulating layer 140 as the first and second heat shrink layers 150 and 160 shrink. In this case, the light emitting layer EL may be separated or divided such that a portion of the light emitting layer EL formed on the third insulating layer 140 and a portion of the light emitting layer EL formed on the second heat shrink layer 160 may be separated from each other.

Figure 3G:
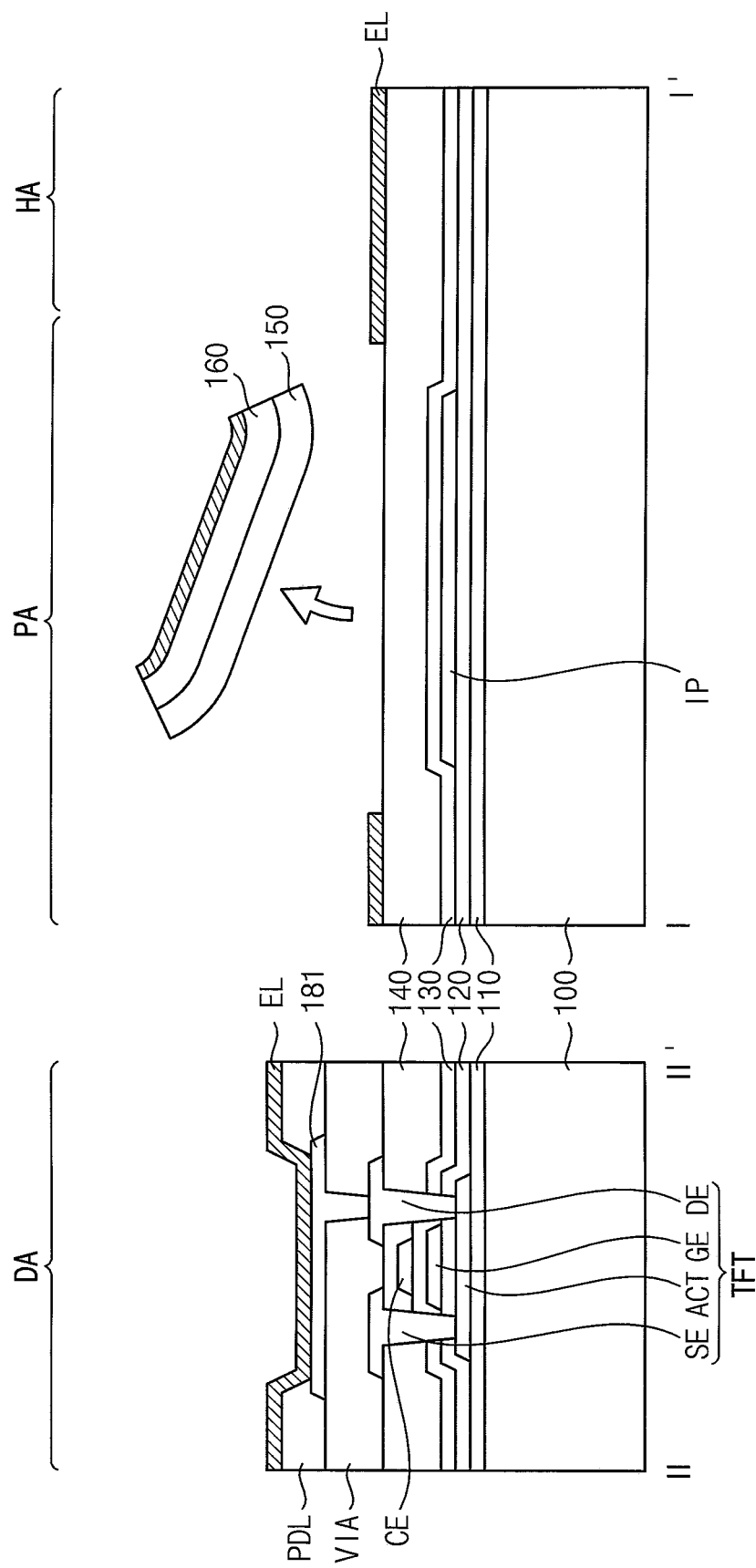

Referring to FIG. 3G, the first heat shrink layer 150, the second heat shrink layer 160, and the light emitting layer EL formed on the second heat shrink layer 160 may be removed from the third insulating layer 140. For example, the first heat shrink layer 150, the second heat shrink layer 160, and the light emitting layer EL formed on the second heat shrink layer 160 may be separated from the third insulating layer 140 by a lift off process. Accordingly, the light emitting layer EL may be disconnected from the third insulating layer 140 in the opening peripheral area PA.

Figure 3H:
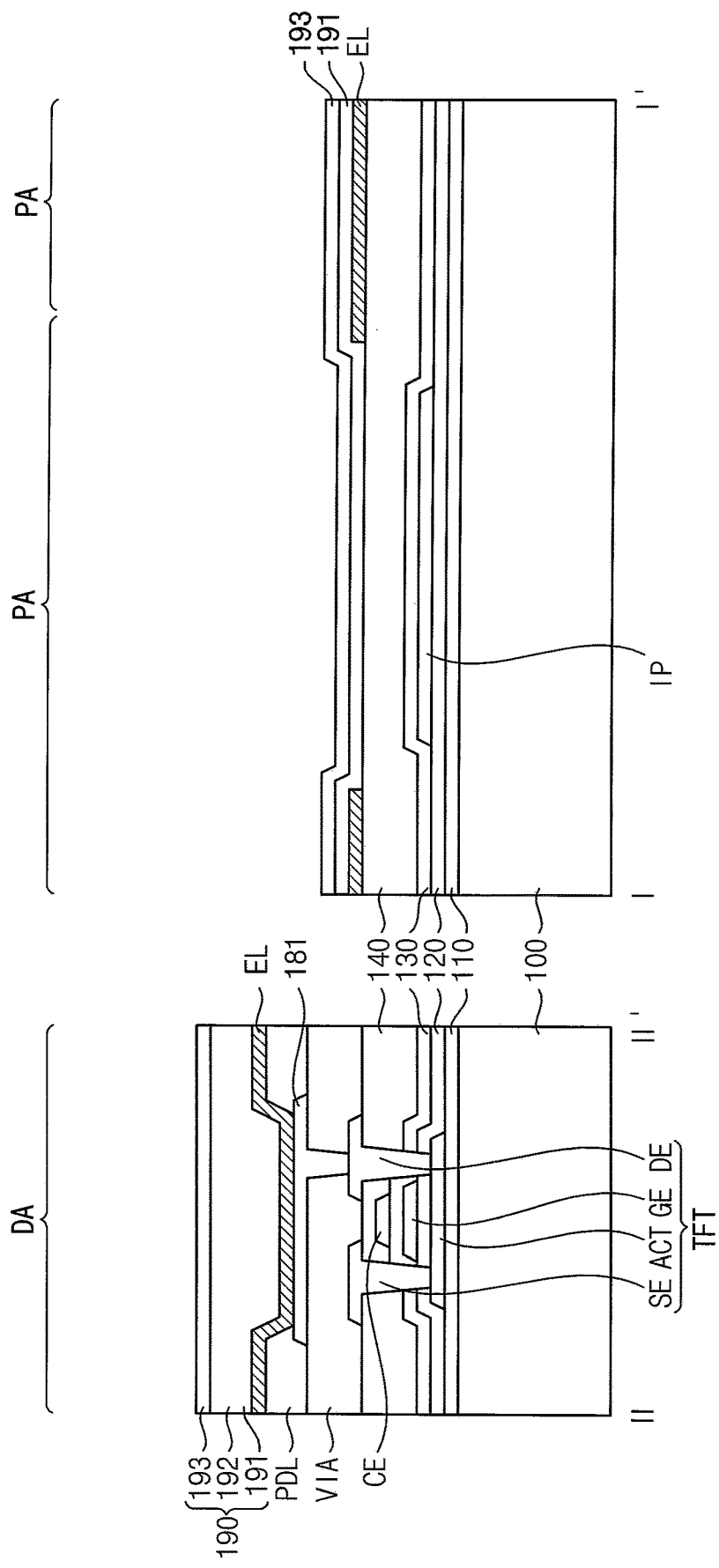

Referring to FIG. 3H, a thin film encapsulation layer 190 may be formed on the light emitting layer EL and the third insulating layer 140. For example, a first inorganic layer 191, the organic layer 192, and the second inorganic layer 193 may be sequentially formed on the light emitting layer EL and the third insulating layer 140. The organic layer 192 is not formed in the opening peripheral area PA and the opening area HA. The first inorganic layer 191 and the second inorganic layer 193 of the thin film encapsulation layer may make contact each other in the opening peripheral area PA. The first inorganic layer 191 may cover side surfaces of the light emitting layer EL disposed in the opening peripheral area PA.

Figure 3I:
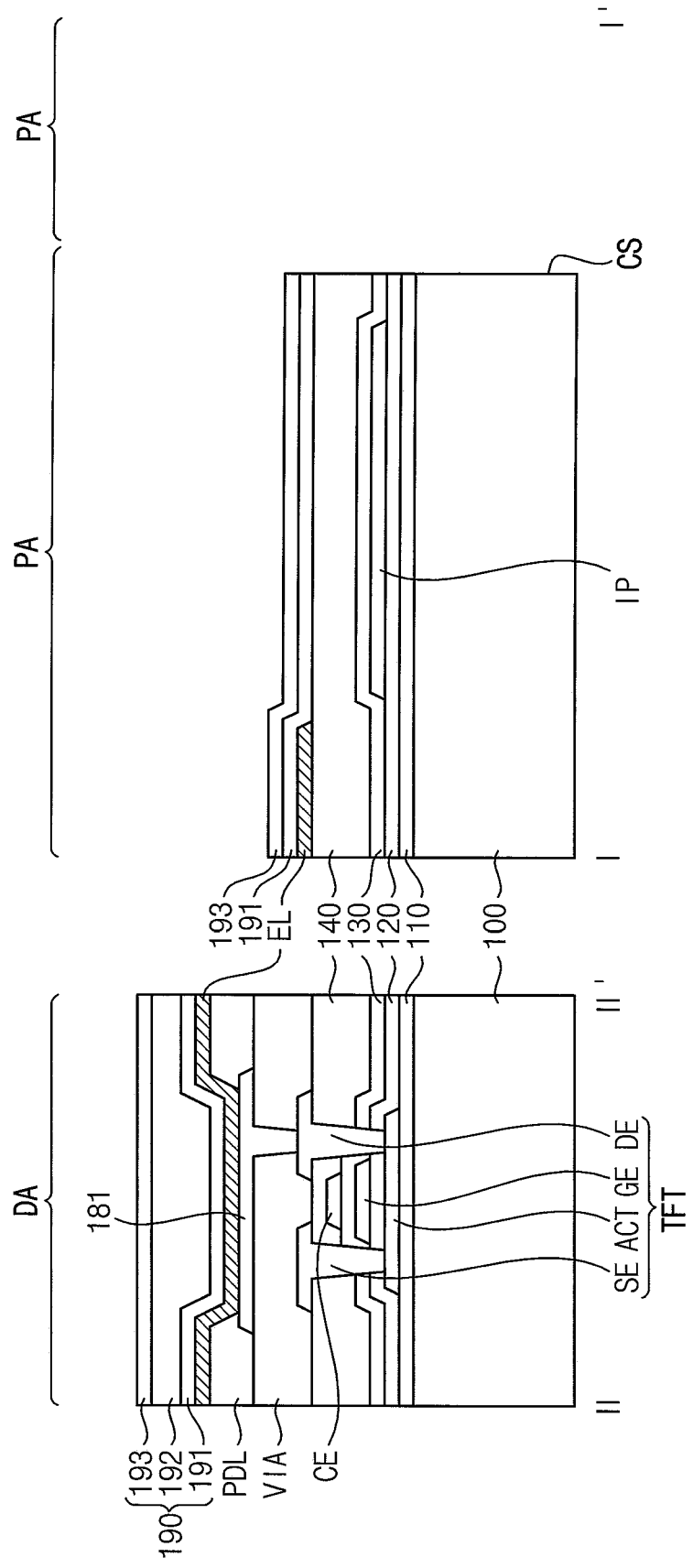

Referring to FIG. 3I, a portion of the base substrate 100, buffer layer 110, first insulating layer 120, second insulating layer 130, third insulating layer 140, light emitting layer EL, first inorganic layer 191, and second inorganic layer 193 corresponding to the opening area HA may be removed to form a hole penetrating the display apparatus. Accordingly, the cutting surface CS forming the hole is formed, and the light emitting layer EL including the organic material is not exposed at the cutting surface CS to the opening area HA. Therefore, external moisture may be prevented from penetrating into the light emitting layer EL including the organic material in the display area DA through the hole of the opening area HA.

FIGS. 4A to 4E are cross-sectional views illustrating a method of manufacturing a display apparatus according to an exemplary embodiment of the present inventive concept. The method is substantially the same as the method of the display apparatus of FIGS. 3A to 3I except that a lift off process is performed after forming a thin film encapsulation layer. Accordingly, repeated descriptions may be simplified or omitted.

Figure 4A:
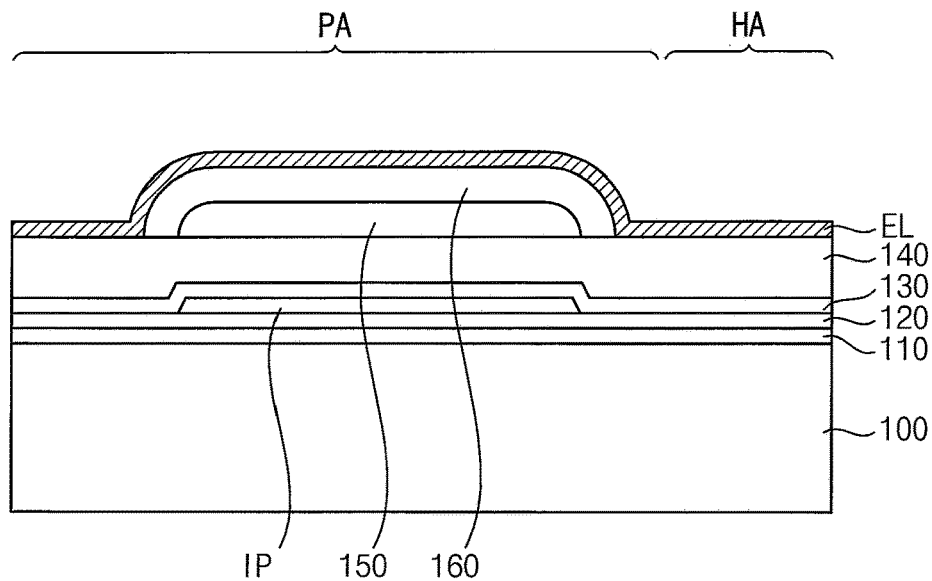
FIGS. 4A, 4B, 4C, 4D and 4E are cross-sectional views illustrating a method of manufacturing a display apparatus according to an exemplary embodiment of the present inventive concept.

Referring to FIG. 4A, in an opening peripheral area PA and an opening area HA, a buffer layer 110, a first insulating layer 120, a heating pattern IP, a second insulating layer 130, a third insulating layer 140, a first heat shrink layer 150, a second heat shrink layer 160, and a light emitting layer EL may be formed (See, e.g., FIGS. 3A-3D).

Figure 4B:
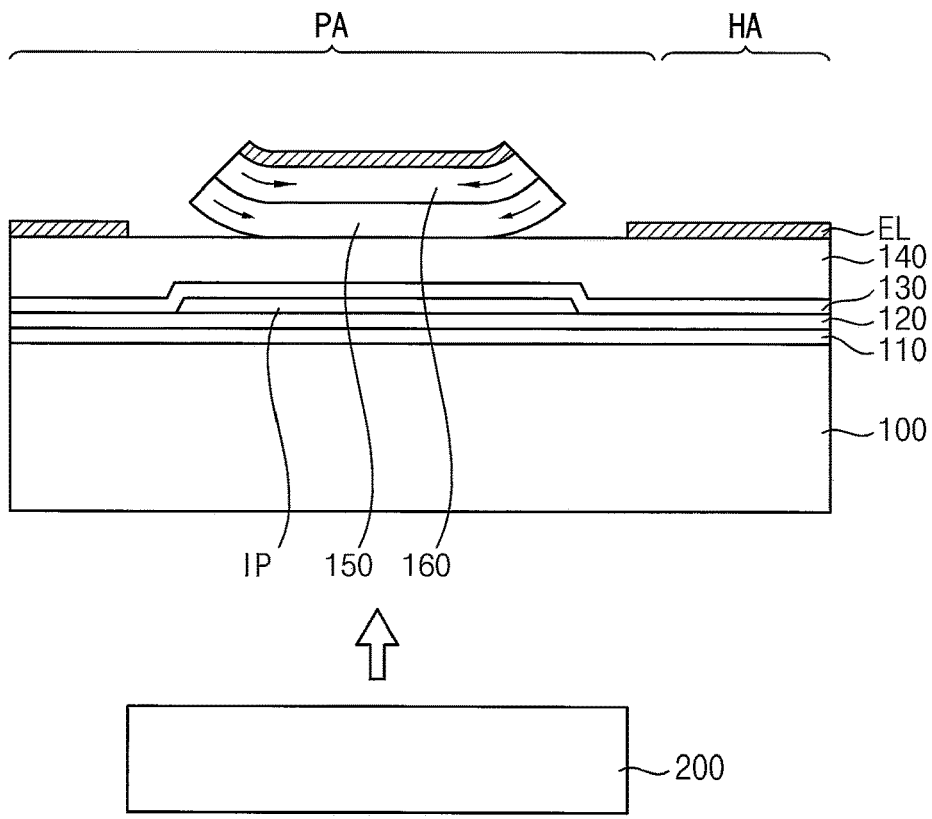

Referring to FIG. 4B, an induced current may be generated by applying a magnetic field to the heating pattern IP. Accordingly, temperature of the heating pattern IP is increased by the induced current flowing through the heating pattern IP, and the first heat shrink layer 150 and the second heat shrink layer 160 are heated (See, e.g., FIGS. 3E and 3F).

Figure 4C:
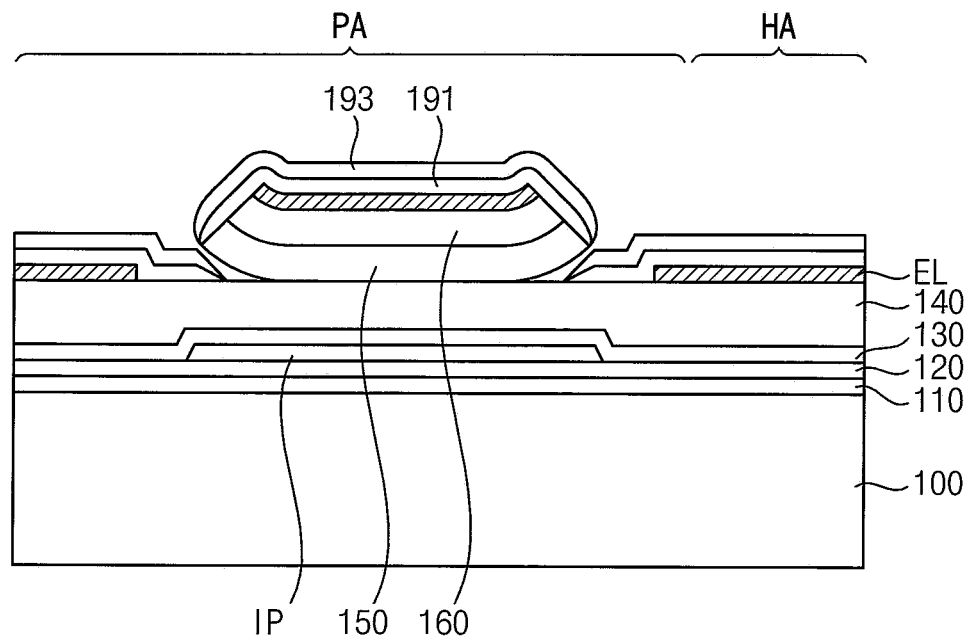

Referring to FIG. 4C, a first inorganic layer 191 and a second inorganic layer 193 of the thin film encapsulation layer may be formed on the first and second heat shrink layers 150 and 160 and the light emitting layer EL. In this case, an under cut due to heat shrinkage of the first and second heat shrink layers 150 and 160 is formed between edges of the first and second heat shrink layers 150 and 160 and the light emitting layer EL remaining on the third insulating layer 140. Side surfaces of the light emitting layer EL remaining on the third insulating layer 140 may be covered by the first inorganic layer 191.

Figure 4D:
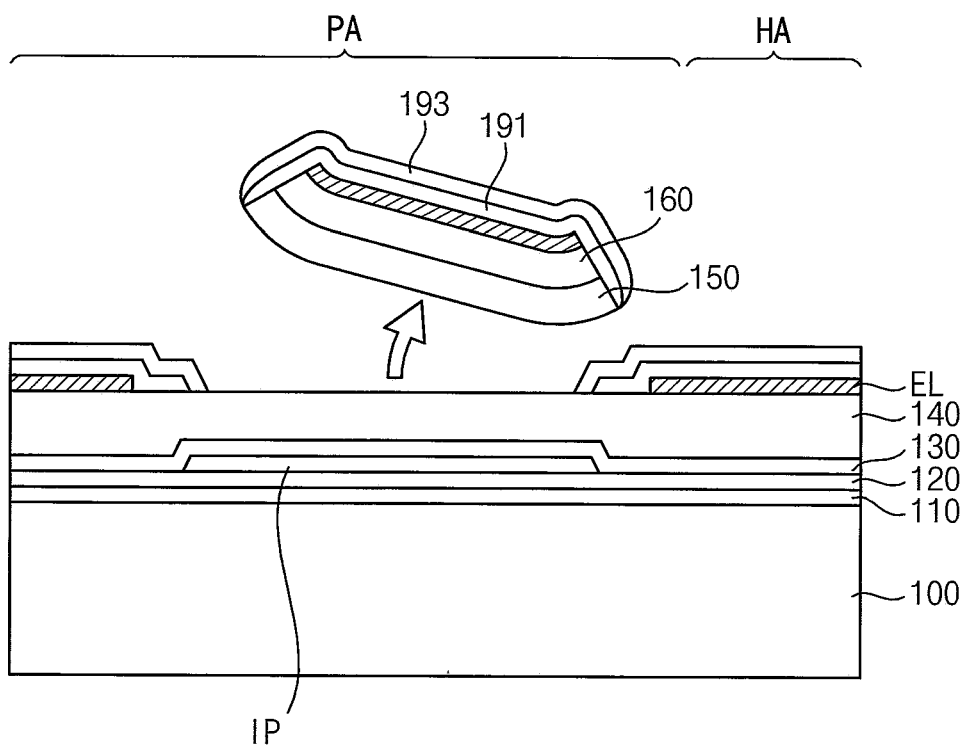

Referring to FIG. 4D, a portion of the light emitting layer EL on the second heat shrink layer 160 and a portion of the first and second inorganic layers 191 and 193 formed on the portion of the light emitting layer EL may be lifted off from the third insulating layer 140 with the first and second heat shrink layers 150 and 160. In this case, the first and second inorganic layers 191 and 193 are not formed in a portion of the opening peripheral area PA that is adjacent to the opening area HA, thereby forming an area in which the third insulating layer 140 is exposed in the opening peripheral area PA.

Figure 4E:
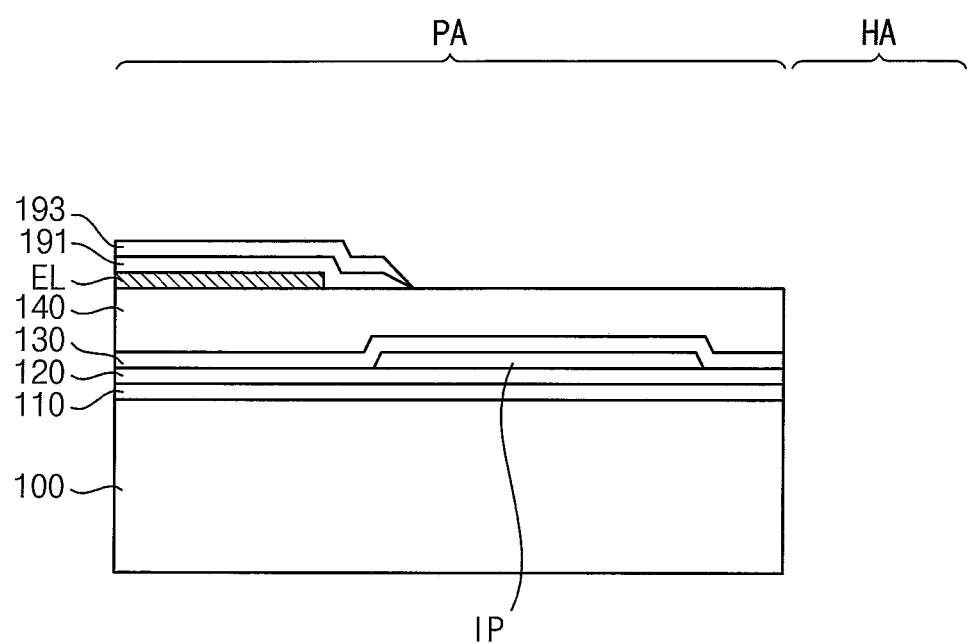

Referring to FIG. 4E, a portion corresponding to the opening area HA may be removed to form a hole penetrating the display apparatus.

FIGS. 5A to 5D are cross-sectional views illustrating a method of manufacturing a display apparatus according to an exemplary embodiment of the present inventive concept. The method is substantially the same as the method of the display apparatus of FIGS. 3A to 3I except that first and second heat shrink layers 150 and 160 are formed not only in an opening peripheral area PA, but also in an opening area HA to form a circle overlapping a heating pattern IP having a ring shape or annular shape. Accordingly, repeated descriptions may be simplified or omitted.

Figure 5A:
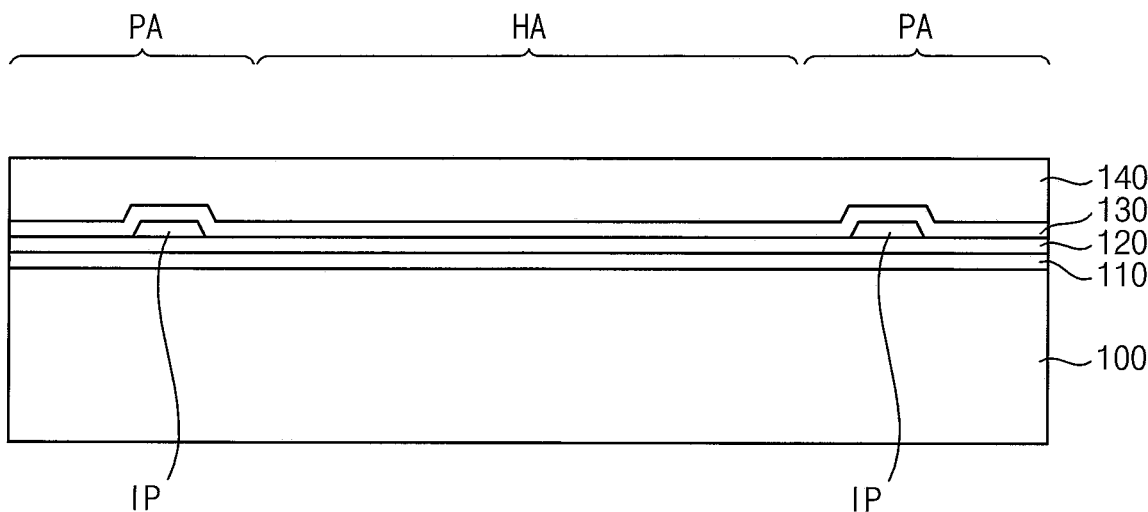
FIGS. 5A, 5B, 5C and 5D are cross-sectional views illustrating a method of manufacturing a display apparatus according to an exemplary embodiment of the present inventive concept.

Referring to FIG. 5A, in the opening peripheral area PA and the opening area HA, the buffer layer 110, the first insulating layer 120, the heating pattern IP, a second insulating layer 130 and a third insulating layer 140 may be formed on the base substrate 100 (See, e.g., FIGS. 3A and 3B).

Figure 5B:
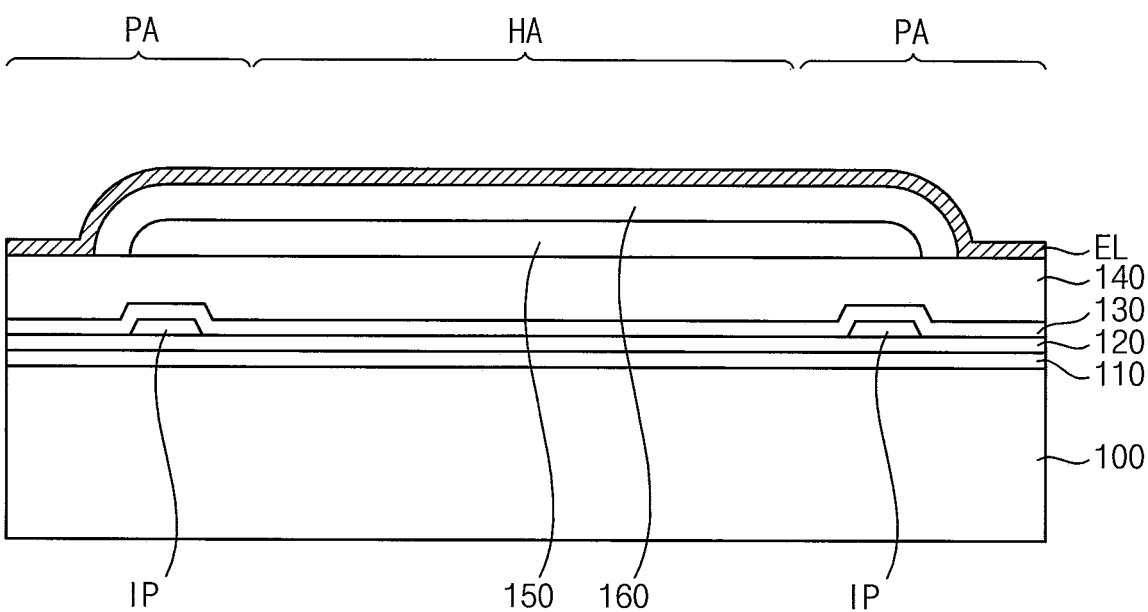

Referring to FIG. 5B, a first heat shrink layer 150 and a second heat shrink layer 160 may be formed on the third insulating layer 140. The first and second heat shrink layers 150 and 160 may be formed in a circular shape overlapping the heating pattern IP. The light emitting layer EL may be formed on the second heat shrink layer 160.

Figure 5C:
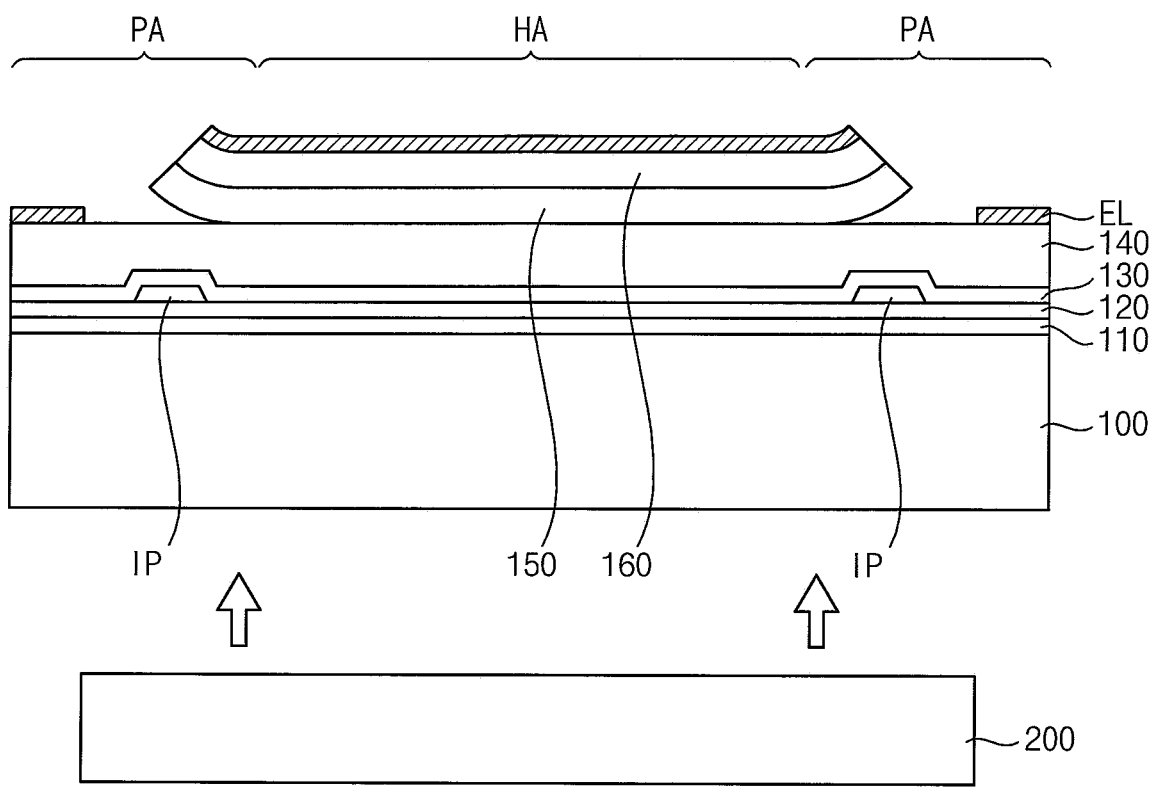

Referring to FIG. 5C, an induced current may be generated by applying a magnetic field to the heating pattern IP. Accordingly, temperature of the heating pattern IP may be increased by the induced current flowing through the heating pattern IP, and the first heat shrink layer 150 and the second heat shrink layer 160 are heated (See, e.g., FIGS. 3E and 3F).

Thereafter, a portion of the light emitting layer EL formed on the second heat shrink layer 160 may be removed from the third insulating layer 140. For example, the portion of the light emitting layer EL formed on the second heat shrink layer 160 may be lifted from the third insulating layer 140 with the first and second heat shrink layers 150 and 160.

Thereafter, a thin film encapsulation layer including the first inorganic layer 191 and the second inorganic layer 193 may be formed.

Figure 5D:
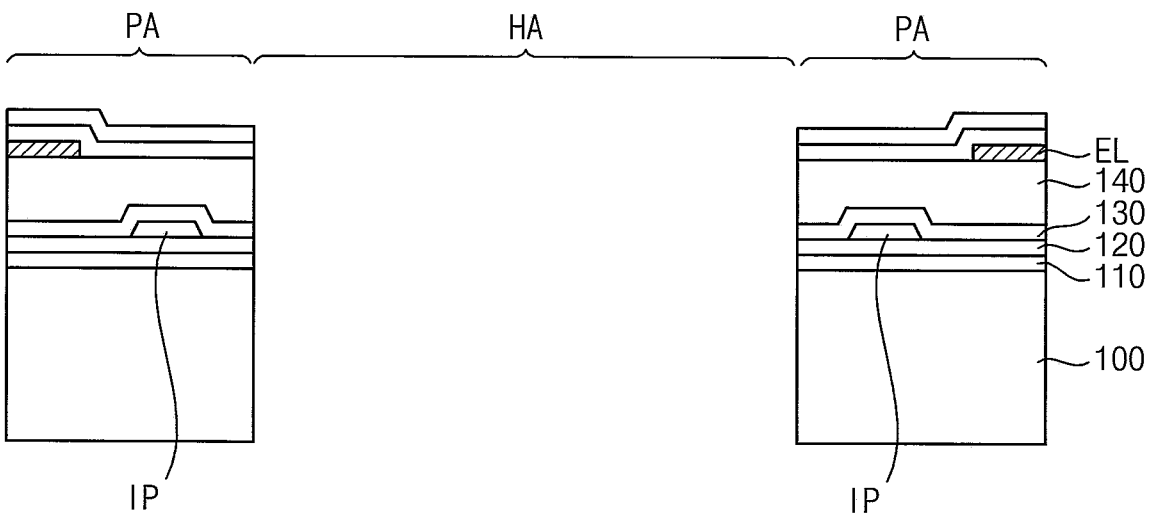

Referring to FIG. 5D, a portion of the base substrate 100, buffer layer 110, first insulating layer 120, second insulating layer 130, third insulating layer 140, first inorganic layer 191, and second inorganic layer 193 corresponding to the opening area HA may be removed to form a hole penetrating the display apparatus.

Figure 6A:
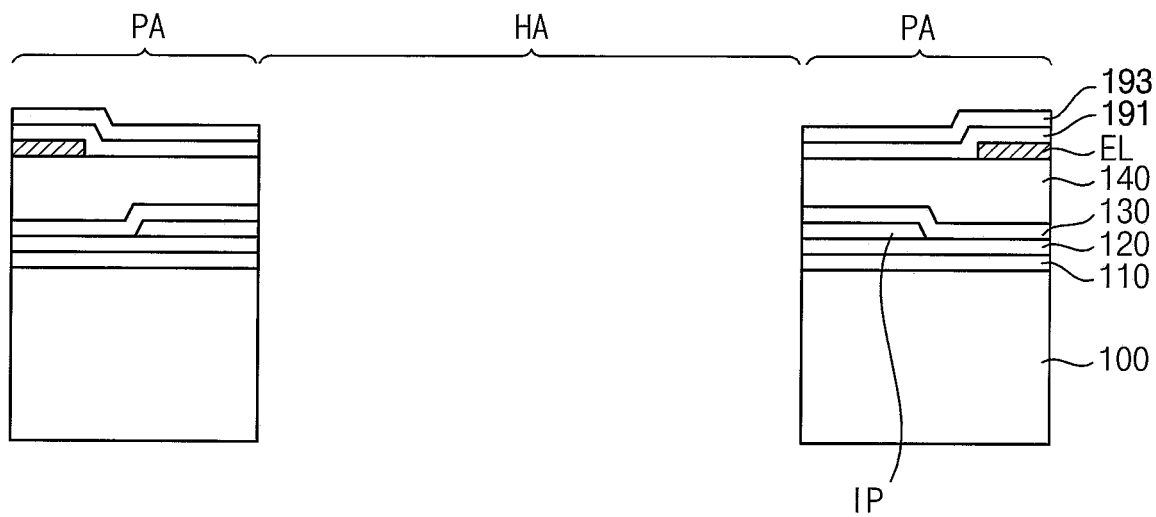
FIGS. 6A, 6B and 6C are cross-sectional views of an opening area of the display apparatus according to an exemplary embodiment of the present inventive concept.
Figure 6B:
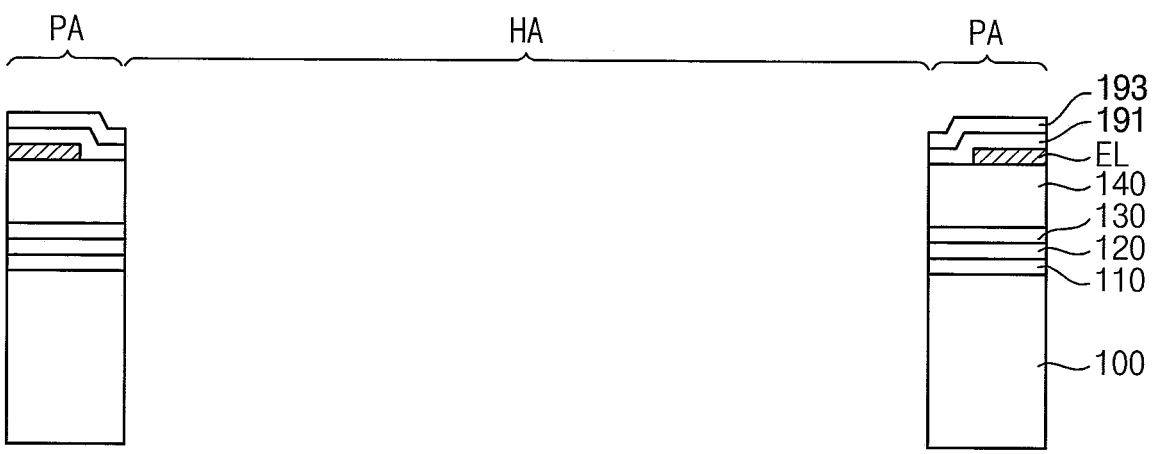
Figure 6C:
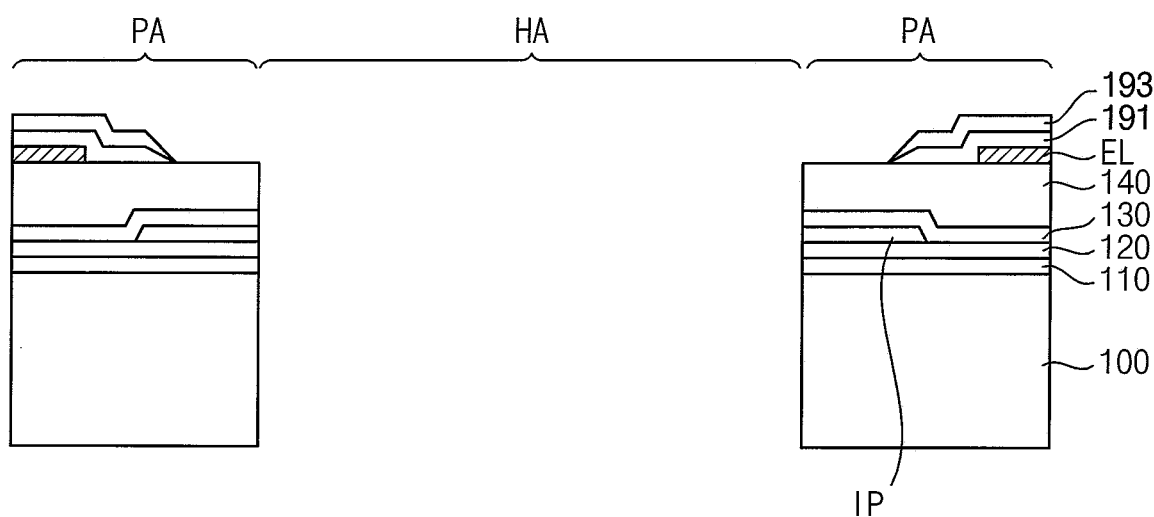

FIGS. 6A through 6C are cross-sectional views of an opening area HA of the display apparatus according to an exemplary embodiment of the present inventive concept. The display apparatuses illustrated in FIGS. 6A through 6C are substantially the same as the display apparatus illustrated in FIG. 2 except for a position of a hole in the opening area HA. Therefore, repeated description may be omitted.

Referring to FIG. 6A, in forming the hole, a portion of the heating pattern IP may be removed to expose a side surface of the heating pattern IP at a cutting surface. For example, the portion of the heating pattern IP may be exposed in the hole formed in the opening area HA.

Referring to FIG. 6B, in forming the hole, all of the heating pattern IP may be removed so that the heating pattern IP does not remain in the display apparatus.

Referring to FIG. 6C, the display apparatus according to an exemplary embodiment of the present inventive concept may be substantially the same as the display apparatus of FIG. 6A except that a portion not covered by a first inorganic layer 191 and a second inorganic layer 193 is formed (See, e.g., FIG. 4E).

According to an exemplary embodiment of the present inventive concept, the display apparatus includes a heating pattern formed in an opening peripheral area and generates an induced current by applying a magnetic field to the heating pattern to heat the first and second heat shrink layers. As a result, a light emitting layer, which is disposed on the first and second heat shrink layers, including organic material may be disconnected in the opening peripheral area.

Accordingly, since the light emitting layer including the organic material is not exposed at a cutting surface in the opening peripheral area to the opening area, external moisture may be prevented from penetrating into the light emitting layer including the organic material in a display area through the hole of the opening area.

In addition, since a relatively complex or relatively large structure for preventing external moisture penetration is not formed in the opening peripheral area, it is possible to reduce a width of the opening peripheral area which is a non-display area.

Figure 7:
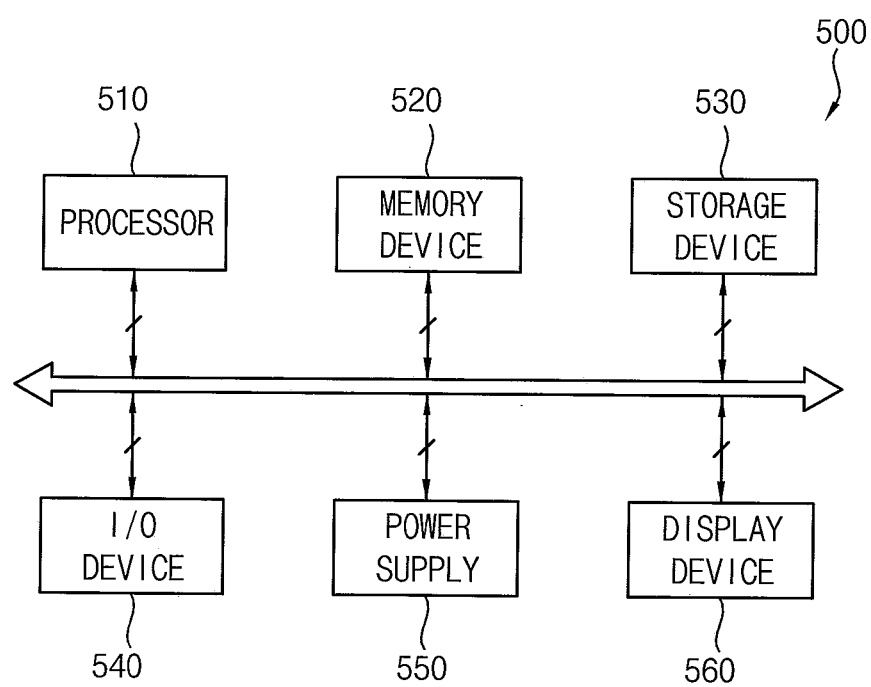
FIG. 7 is a block diagram illustrating an electronic device according to an exemplary embodiment of the present inventive concept.
Figure 8A:
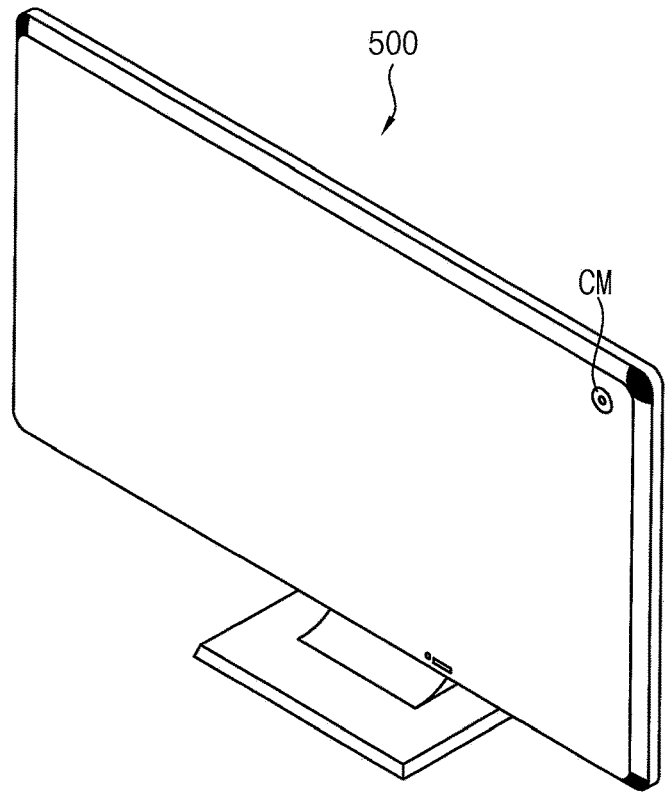
FIG. 8A is a diagram illustrating an example in which the electronic device of FIG. 7 is implemented as a television.
Figure 8B:
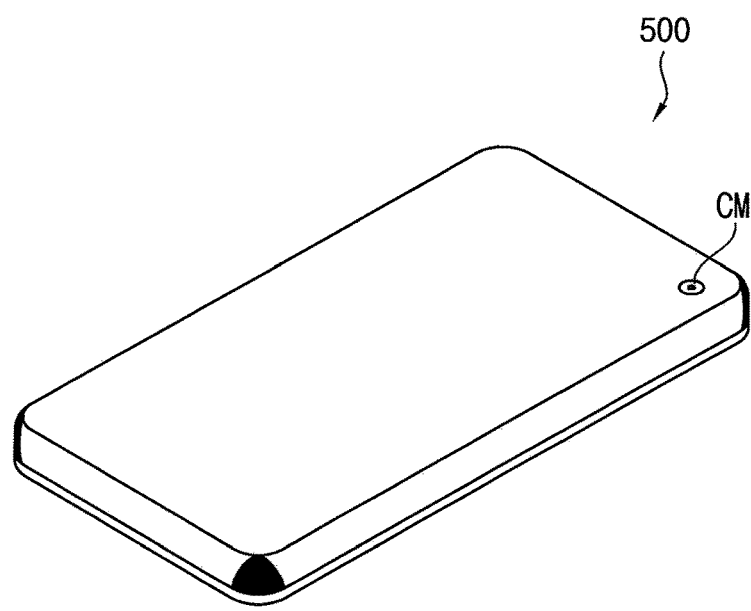
FIG. 8B is a diagram illustrating an example in which the electronic device of FIG. 7 is implemented as a smart phone.

FIG. 7 is a block diagram illustrating an electronic device according to an exemplary embodiment of the present inventive concept. FIG. 8A is a diagram illustrating an example in which the electronic device of FIG. 7 is implemented as a television. FIG. 8B is a diagram illustrating an example in which the electronic device of FIG. 7 is implemented as a smart phone.

Referring to FIGS. 7 through 8B, the electronic device 500 may include a processor 510, a memory device 520, a storage device 530, an input/output (I/O) device 540, a power supply 550, and a display apparatus 560. Here, the display apparatus 560 may correspond to the display apparatus of FIG. 1. In addition, the electronic device 500 may further include a plurality of ports for communicating with a video card, a sound card, a memory card, a universal serial bus (USB) device, other electronic devices, etc. In an exemplary embodiment of the present inventive concept, as illustrated in FIG. 8A, the electronic device 500 may be implemented as a television. In an exemplary embodiment of the present inventive concept, as illustrated in FIG. 8B, the electronic device 500 may be implemented as a smart phone. However, the electronic device 500 is not limited thereto. For example, the electronic device 500 may be implemented as a cellular phone, a video phone, a smart pad, a smart watch, a tablet PC, a car navigation system, a computer monitor, a laptop, a head mounted display (HMD), etc.

The processor 510 may perform various computing functions. The processor 510 may be a micro processor, a central processing unit (CPU), an application processor (AP), etc. The processor 510 may be coupled to other components via an address bus, a control bus, a data bus, etc. Further, the processor 510 may be coupled to an extended bus such as a peripheral component interconnection (PCI) bus. The memory device 520 may store data for operations of the electronic device 500. For example, the memory device 520 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc., and/or at least one volatile memory device such as a dynamic random access memory (DRAM) device, a static random access memory (SRAM) device, a mobile DRAM device, etc. The storage device 530 may include a solid state drive (SSD) device, a hard disk drive (HDD) device, a CD-ROM device, etc. The I/O device 540 may include an input device such as a keyboard, a keypad, a mouse device, a touchpad, a touch-screen, etc., and an output device such as a printer, a speaker, etc. The power supply 550 may provide power for operations of the electronic device 500.

The display apparatus 560 may be coupled to other components via the buses or other communication links. In an exemplary embodiment of the present inventive concept, the display apparatus 560 may be included in the I/O device 540. As described above, the display apparatus 560 includes a heating pattern formed in an opening peripheral area and generates an induced current by applying a magnetic field to the heating pattern to heat the first and second heat shrink layers. As a result, a light emitting layer including organic material may be disconnected in the opening peripheral area. Accordingly, since the light emitting layer including the organic material is not exposed at a cutting surface in the opening peripheral area to an opening area, external moisture may be prevented from penetrating into the light emitting layer including the organic material in a display area through the hole of the opening area. In addition, since a relatively complex or relatively large structure for preventing external moisture penetration is not formed in the opening peripheral area it is possible to reduce a width of the opening peripheral area which is a non-display area. However, since this has been described above, a duplicate description thereof will be omitted.

The present inventive concept can be applied to organic light emitting display devices and various electronic devices including the same. For example, the present inventive concept can be applied to a mobile phone, a smart phone, a video phone, a smart pad, a smart watch, a tablet PC, a car navigation system, a television, a computer monitor, a notebook, and the like.

While the present inventive concept has been described with reference to exemplary embodiments thereof, it will be understood by those of ordinary skill in the art that various changes in form and details may be made thereto without departing from the spirit and scope of the present inventive concept.

What is claimed is:

1. A display apparatus, comprising:
    a base substrate including a display area, an opening area, and an opening peripheral area between the opening area and the display area, wherein the display area surrounds the opening area, and the opening peripheral area has an annular shape;
    a conductive pattern disposed on the base substrate in the opening peripheral area and having an annular shape; and
    a light emitting layer disposed on the base substrate and in a portion of the opening peripheral area, and including an organic material, and
    wherein the light emitting layer is not formed at a portion of opening peripheral area that is adjacent to the opening area.

2. The display apparatus of claim 1, wherein the conductive pattern comprises metal.

3. The display apparatus of claim 2, wherein the conductive pattern is spaced apart from the light emitting layer.

4. The display apparatus of claim 1, wherein a hole penetrating the display apparatus is formed in the opening area, and a cutting surface providing the hole is formed, and
    the cutting surface and the light emitting layer formed in the opening peripheral area are spaced apart from each other.

5. The display apparatus of claim 4, wherein the conductive pattern is disposed between the cutting surface and the light emitting layer.

6. The display apparatus of claim 4, wherein the conductive pattern is exposed at the cutting surface.

7. The display apparatus of claim 1, further comprises:
    an active pattern disposed on the base substrate in the display area;
    a first insulating layer disposed on the base substrate;
    a gate pattern including a gate electrode of a thin film transistor and the conductive pattern, and disposed on the first insulating layer;
    a second insulating layer disposed on the gate pattern;
    a source drain pattern disposed on the second insulating layer and including a source electrode and a drain electrode of the thin film transistor, wherein the source electrode and the drain electrode are electrically connected to the active pattern;
    a via insulating layer disposed on the source drain pattern in the display area;
    a pixel electrode disposed in the display area and between the via insulating layer and the light emitting layer, wherein the pixel electrode is electrically connected to the thin film transistor; and
    a thin film encapsulation layer disposed on the light emitting layer and including a first inorganic layer, an organic layer disposed on the first inorganic layer, and a second inorganic layer disposed on the organic layer.

8. The display apparatus of claim 7, wherein the organic layer of the thin film encapsulation layer is not formed in the opening peripheral area, wherein the first inorganic layer and the second inorganic layer of the thin film encapsulation layer contact each other, and
    the first inorganic layer covers a side surface of the light emitting layer disposed in the opening peripheral area.

9. The display apparatus of claim 7, wherein the first and second inorganic layers are not formed in the portion of the opening peripheral area that is adjacent to the opening area.

10. A display apparatus, comprising:
    a base substrate including a display area, an opening area, and an opening peripheral area between the opening area and the display area, wherein the display area surrounds the opening area, and the opening peripheral area has an annular shape; and
    a light emitting layer disposed on the base substrate and in a portion of the opening peripheral area, and including an organic material,
    wherein a hole penetrating the display apparatus is formed in the opening area, and a cutting surface providing the hole is formed, and
    the cutting surface and the light emitting layer formed in the opening peripheral area are spaced apart from each other.

* * * * *